(12) United States Patent
Takeuchi et al.

(10) Patent No.: US 6,373,353 B1
(45) Date of Patent: Apr. 16, 2002

(54) SURFACE ACOUSTIC WAVE TRANSDUCER USING NSPUDT PROPERTY SUBSTRATE AND SURFACE ACOUSTIC WAVE FILTER USING THE TRANSDUCER

(75) Inventors: Masao Takeuchi, Machida; Kazuhiko Yamanouchi; Hiroyuki Odagawa, both of Sendai; Mitsuhiro Tanaka, Chita-gun, all of (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 08/860,606

(22) PCT Filed: Nov. 8, 1996

(86) PCT No.: PCT/JP96/03284

§ 371 Date: Nov. 18, 1997

§ 102(e) Date: Nov. 18, 1997

(87) PCT Pub. No.: WO97/17757

PCT Pub. Date: May 15, 1997

(30) Foreign Application Priority Data

Nov. 8, 1995 (JP) .............................. 7-290057

(51) Int. Cl.$^7$ ........................... H03H 9/64; H03H 9/145
(52) U.S. Cl. .................. 333/193; 333/195; 310/313 A; 310/313 B; 310/313 D
(58) Field of Search ................................ 333/193–196, 333/150, 154; 310/313 R, 313 A, 313 B, 313 C, 313 D

(56) References Cited

U.S. PATENT DOCUMENTS

| | | | | |
|---|---|---|---|---|
| 4,670,680 A | * | 6/1987 | Andle | 310/313 A |
| 4,670,681 A | * | 6/1987 | Wright | 310/313 A |
| 4,731,595 A | | 3/1988 | Wright | 333/195 |
| 4,910,839 A | * | 3/1990 | Wright | 310/313 B X |

(List continued on next page.)

FOREIGN PATENT DOCUMENTS

| | | | |
|---|---|---|---|
| DE | 44 38 645 A1 | * 5/1996 | |
| JP | 60-123123 | 7/1985 | |
| JP | 61-6916 A | 1/1986 | |
| JP | 4-309005 | * 10/1992 | ................. 333/193 |
| JP | 5-226961 A | 9/1993 | |
| JP | 7-22889 | * 1/1995 | |

OTHER PUBLICATIONS

C.S. Lam et al., "A Low–Loss SAW Filter Using Two–Finger Per Wavelength Electrodes on the NSPUDT Orientation of Quartz", IEEE 1993 Ultrasonics Symposium, vol. 1, Nov. 1993, pp. 185–188.*

M. Takeuchi et al., "Crystal Orientations for Natural Single Phase Unidirectional Tranducer (NSPUDT) on $Li_2B_4O_7$", Electronics Letters, vol. 30, No. 24, Nov. 1994, pp 2081–2082.*

(List continued on next page.)

Primary Examiner—Benny Lee
Assistant Examiner—Barbara Summons
(74) Attorney, Agent, or Firm—Parkhurst & Wendel, L.L.P

(57) ABSTRACT

In order to provide a transducer suitable for an anisotropic substrate having the NSPUDT property, on the anisotropic piezoelectric substrate being cut to have the NSPUDT property, there is formed a transducer structure having an exciting electrode structure (21) and a reflector structure (22). When λ is a wavelength of a fundamental surface acoustic wave, said exciting electrode structure (21) includes a positive electrode (23) having a plurality of electrode fingers arranged at a pitch λ and a negative electrode (24) having at least one electrode finger interdigitally arranged between said electrode fingers of the positive electrode with a center distance of λ/2. The reflector transducer (22) includes a plurality of electrode fingers arranged with a center distance of λ/2, and a distance $L_g$ between said exciting electrode structure (21) and the reflector structure (22) is set to $L_g=(2n+1)\lambda/4$ (n being a positive integer).

22 Claims, 19 Drawing Sheets

U.S. PATENT DOCUMENTS

| | | | | |
|---|---|---|---|---|
| 5,073,763 A | * | 12/1991 | Wright | 333/193 |
| 5,081,389 A | * | 1/1992 | Abbott et al. | 310/313 A |
| 5,550,793 A | * | 8/1996 | Dufilie | 333/193 X |
| 5,698,927 A | * | 12/1997 | Tanaka et al. | 310/313 A |
| 5,773,911 A | * | 6/1998 | Tanaka et al. | 333/194 X |

OTHER PUBLICATIONS

P.V. Wright, "Low–Cost High–Performance Resonator and Coupled–Resonator Design: NSPUDT and Other Innovative Structures", 1989, pp. 574–587, IEEE Proced. $43^{rd}$ Annual Symposium on Frequency Control.

M. Takeuchi et al., "Saw Transducer Configurations for Reversing the Directivity of NSPUDT Substrates", 1995, pp. 17–22, IEEE 1995 Ultrasonics Symposium.

M. Takeuchi et al., "Low–Loss Saw Filters on Nspudt Orientations of a Li2B4O7 Substrate," 1996 IEEE International Frequency Control Symposium, Jun. 5, 1996, pp 266–272.

* cited by examiner

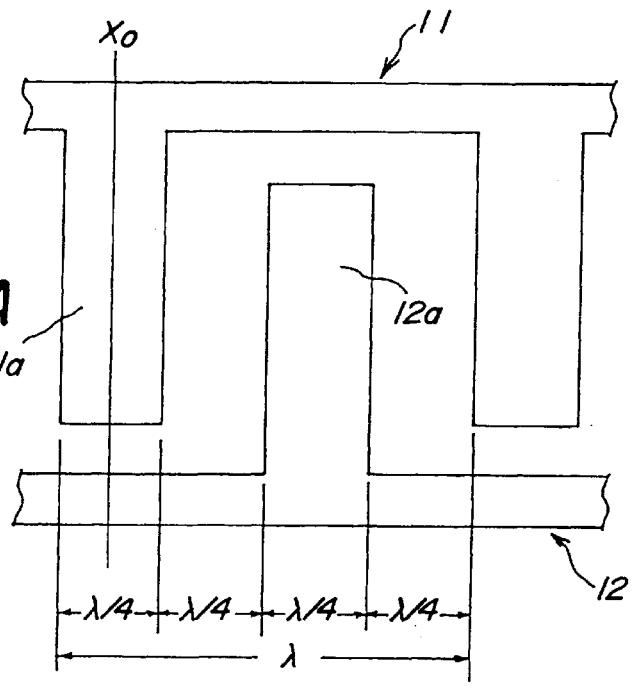
FIG. 2A
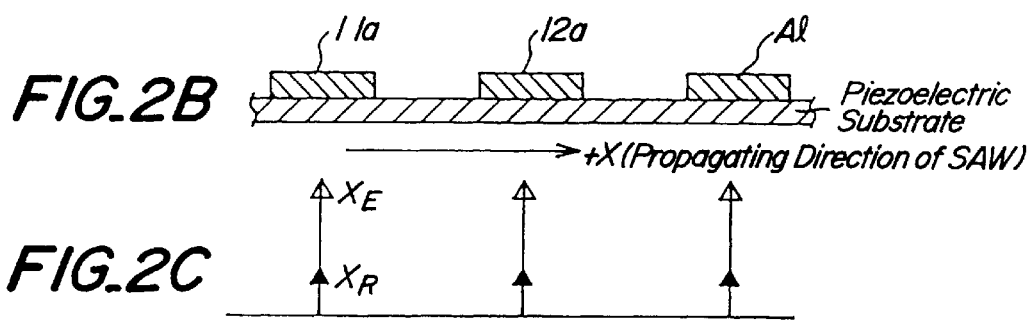
FIG. 2B
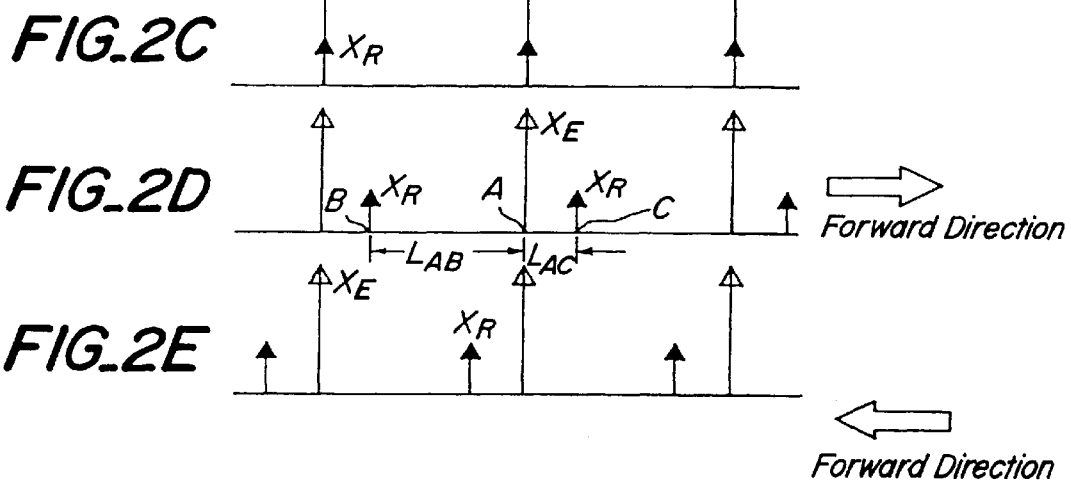
FIG. 2C
FIG. 2D
FIG. 2E

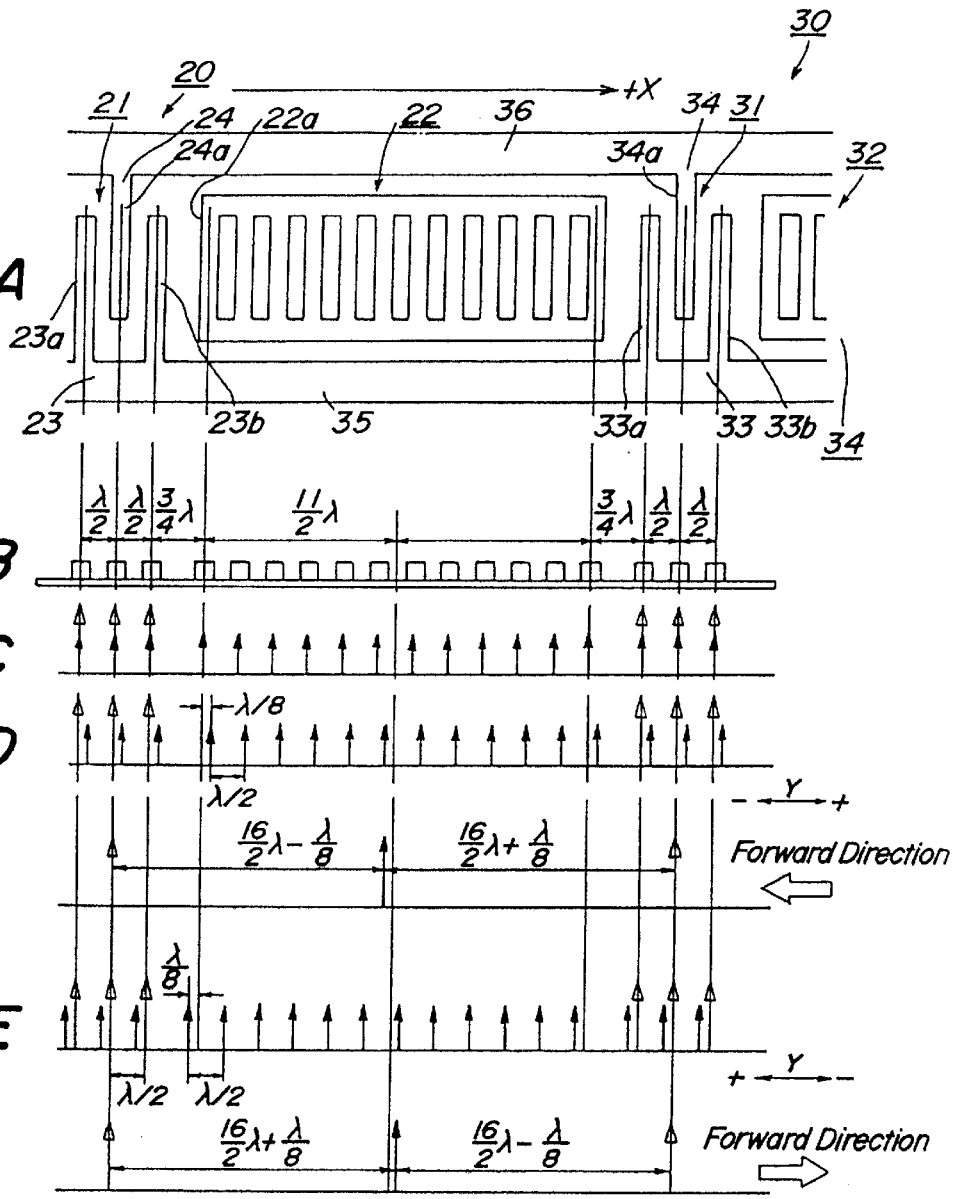

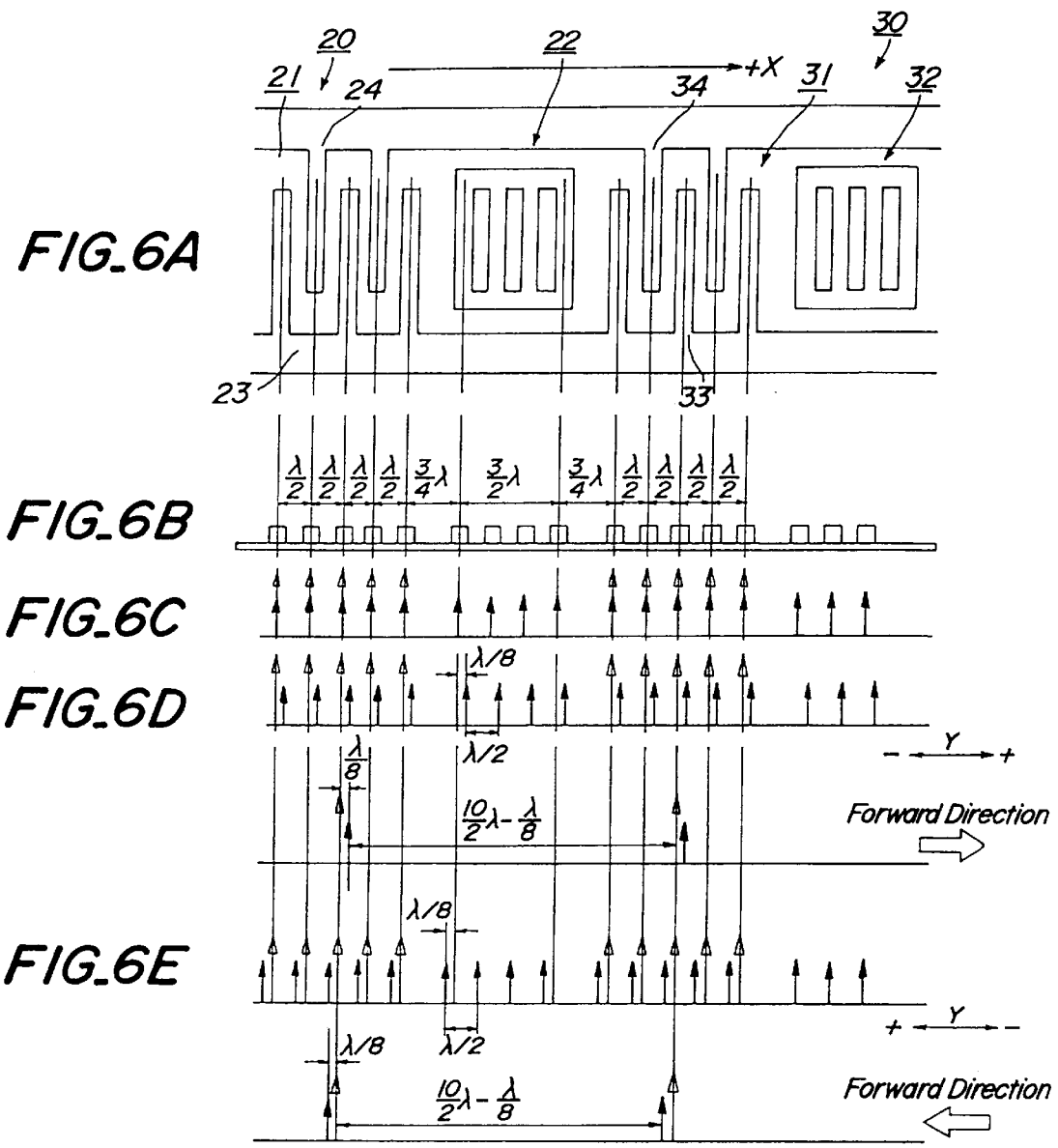

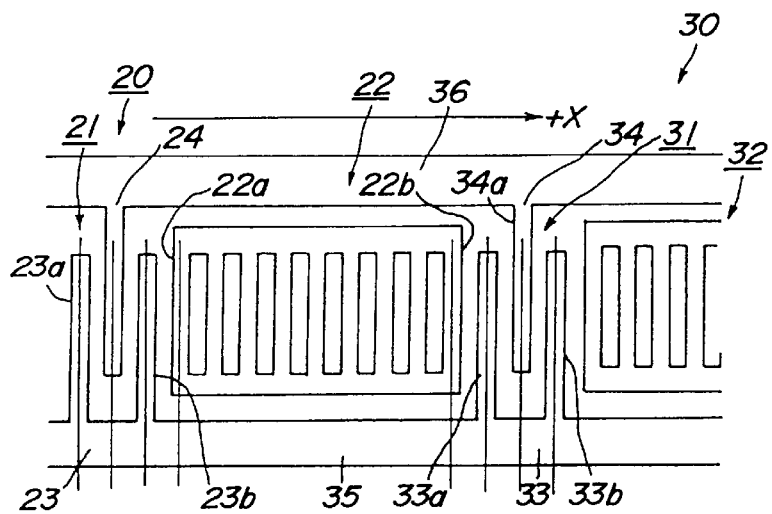
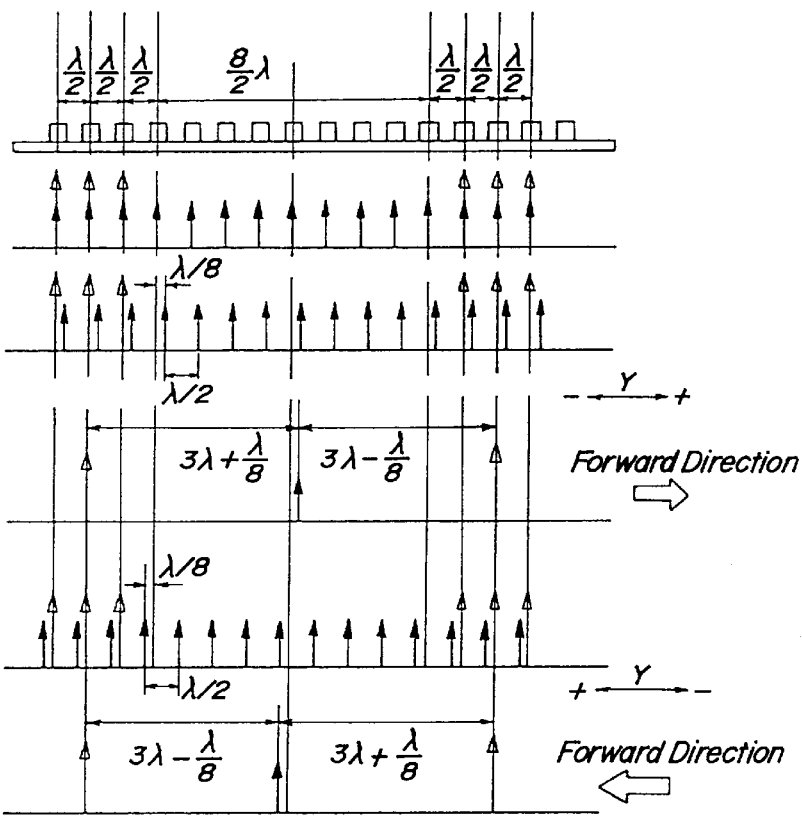

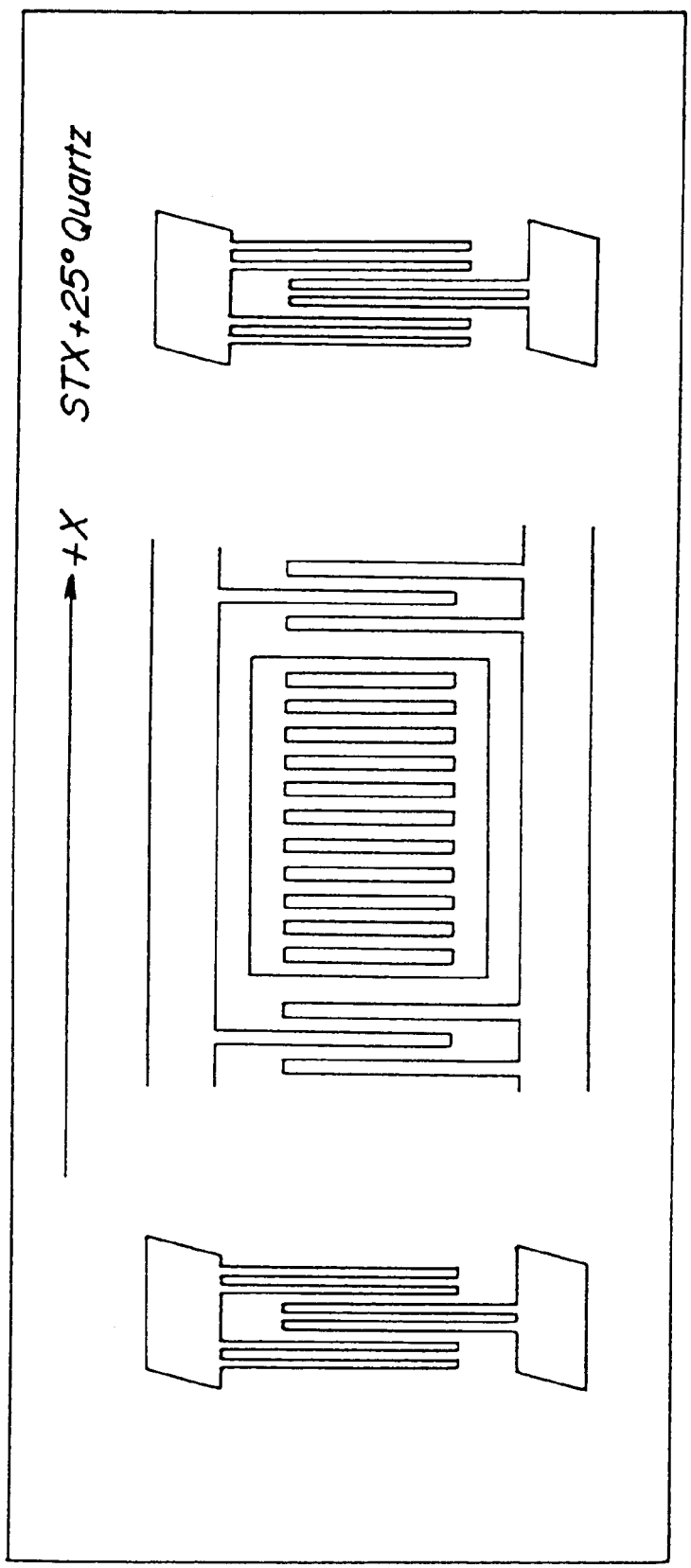

FIG_9
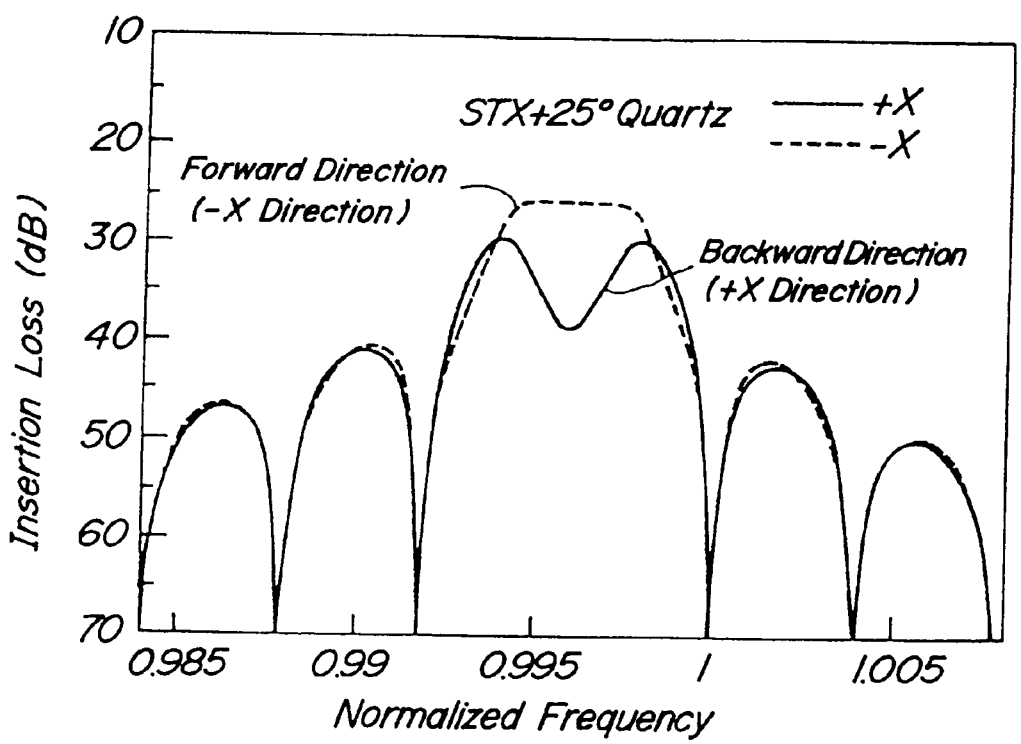

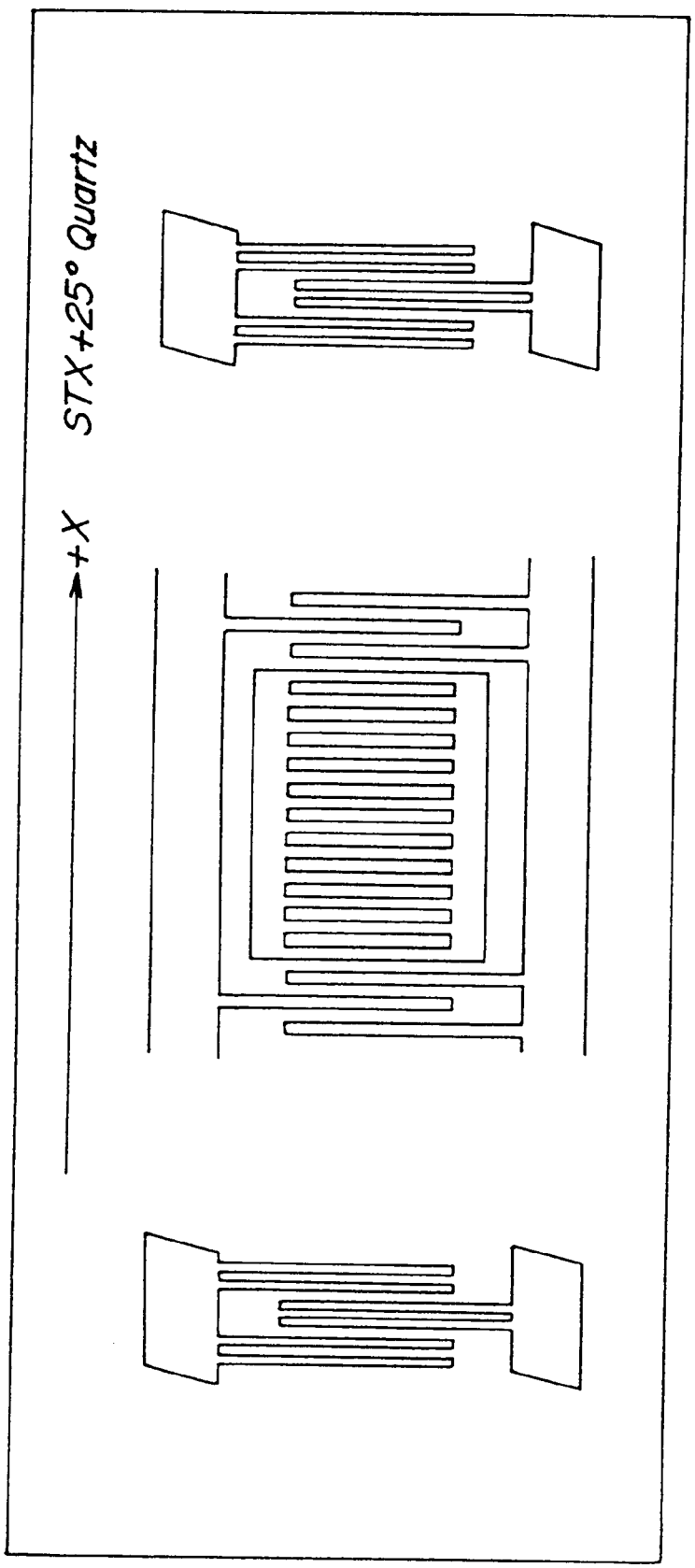
FIG._10

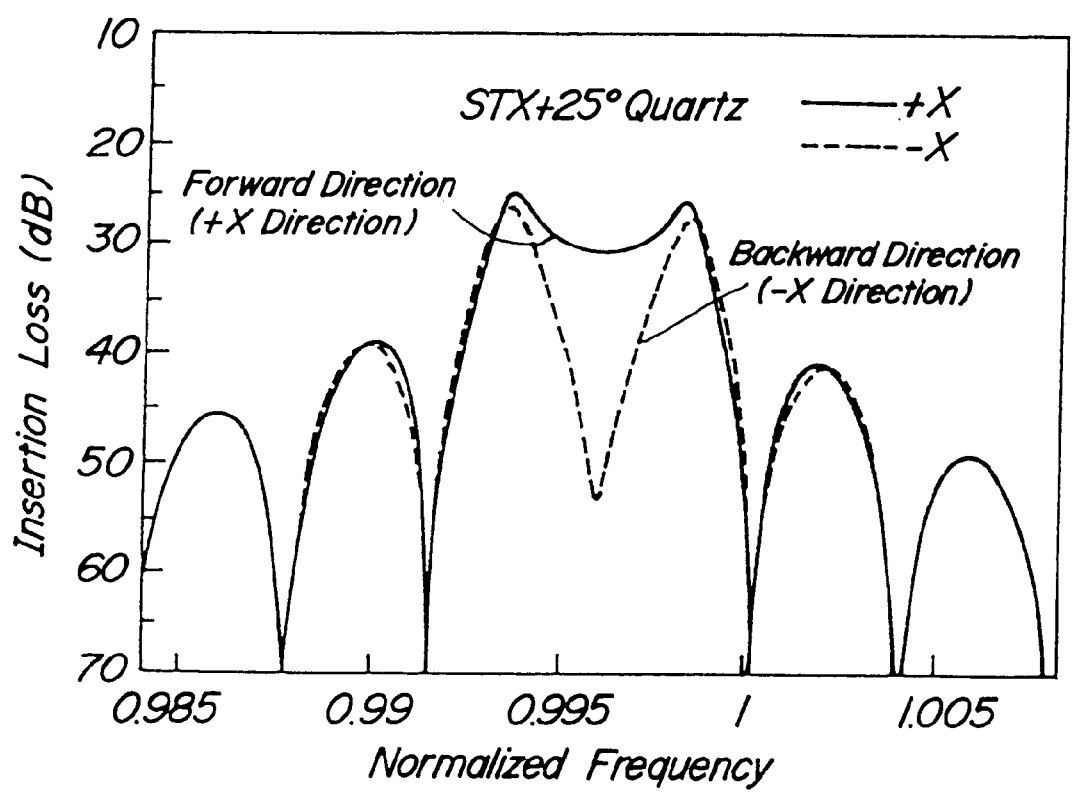
FIG_11

FIG_13

FIG._14

FIG_16

FIG._17

FIG_18

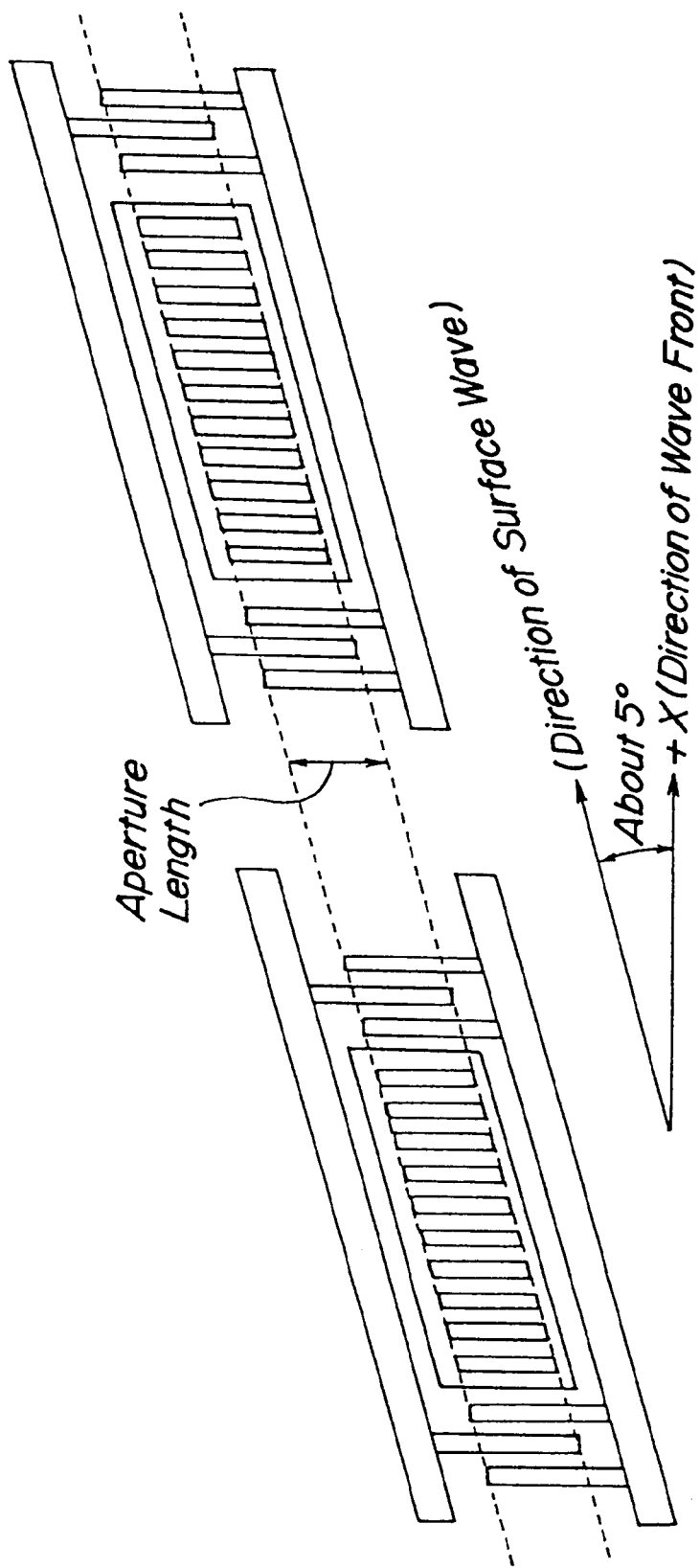

SURFACE ACOUSTIC WAVE TRANSDUCER USING NSPUDT PROPERTY SUBSTRATE AND SURFACE ACOUSTIC WAVE FILTER USING THE TRANSDUCER

TECHNICAL FIELD

The present invention relates to a surface acoustic wave transducer for use in a surface acoustic wave device such as a SAW filter and a SAW resonator, and more particularly to a surface acoustic wave transducer comprising a piezoelectric substrate having a natural single-phase unidirectional transducer (termed as NSPUDT) property and an electrode structure having a directivity. The present invention also relates to a surface acoustic wave filter having such a transducer.

TECHNICAL BACKGROUND

Heretofore, there has been widely used a transversal type SAW filter, in which on a surface of a piezoelectric substrate, are arranged a transmitter side transducer including interdigitally arranged positive and negative electrodes to be connected to two output terminals of a single phase signal source having a phase difference of 180°, and a receiver side transducer also including interdigitally arranged positive and negative electrodes, said transmitter and receiver side transducers being separated by a given distance so as to extract a specific frequency.

In such a SAW filter, it is required to reduce an insertion loss as well as to suppress a ripple within a given frequency band. Since a conventional interdigital electrode structure shows the bidirectionality, a theoretical insertion loss amounts to 6 dB and thus the insertion loss could not be suppressed any more. Furthermore, in order to improve a performance of the surface acoustic wave device, not only the insertion loss has to be decreased, but also it is also important to flatten a phase characteristic and to improve a frequency characteristic such as a suppression of ripple within a pass band and a suppressed band.

In order to satisfy the above mentioned requirements, there has been used a unidirectional transducer, in which an insertion loss can be suppressed to a value not larger than 1 dB and good phase and frequency characteristics can be attained. For the unidirectional transducer, there have been proposed various kinds of types, which may be roughly classified into (a) multi-phase type unidirectional transducer and (b) single-phase type unidirectional transducer. Further, for the latter single-phase unidirectional transducer, there have been proposed a single-phase unidirectional transducer utilizing an internal reflection due to asymmetry of an electrode structure and mass load effect, a single-phase unidirectional transducer utilizing a reflection by a floating electrode, and a natural single-phase unidirectional transducer utilizing an anisotropy of a substrate. In surface acoustic wave devices using such unidirectional transducers, the directivity is attained by a fact that a phase difference between an exiting wave and an excited wave and a reflected wave have the same phase viewed in a propagating direction, but have opposite phased viewed in a direction opposite to the propagating direction.

In the above mentioned single-phase unidirectional transducers other than the natural single-phase unidirectional transducer, the electrode structure is complicated, and particularly an edge distance and a width of electrode fingers have to be smaller than $\lambda/4$. In accordance with an increase in an operating frequency, said dimensions become extremely small, and it is difficult to manufacture accurately the electrodes having the desired dimensions.

As one solution for solving such a problem, there has been proposed a natural single-phase unidirectional transducer (NSPUDT), in which due to the anisotropy of the substrate itself, the unidirectionality can be attained even by using a conventional electrode, in which the edge distance and width of electrodes are set to $\lambda/4$. In this surface acoustic wave device utilizing the NSPUDT behavior, the anisotropy of the substrate itself is utilized. Quartz substrate, $LiNbO_3$ substrate and $LiTaO_3$ substrate have been known as such a piezoelectric substrate showing the unidirectionality due to the anisotropy. The inventors have further recognized that a lithium tetraborate substrate of a special cut shows the NSPUDT property. Particularly, upon being compared with the other substrates showing the natural single-phase unidirectional transducer property, this lithium tetraborate substrate could provide an ideal surface acoustic wave device due to a fact that it has a large electromechanical coupling constant $K^2$, a zero delay time temperature coefficient, a zero power flow angle and so on.

However, in the surface acoustic wave device utilizing the above mentioned NSPUDT, since the anisotropy of the substrate itself is utilized, there is a problem that it is difficult to obtain unidirectional transducers whose forward directions are opposed to each other, one for the output side, i.e. transmitter side transducer and the other for the input side, i.e. receiver side transducer. In order to solve this problem, there have been proposed various methods for reversing the directivity. For instance, the directivity of one of the transmitter and receiver side transducers may be reversed by using electrodes made of a material whose phase of reflection coefficient is different from that of the other transducer by 180°, or by providing recesses in a substrate surface and embedding electrodes in the recesses.

However, according to the generally used manufacturing process, the formation of electrodes from different electrode materials and the embedded electrodes might cause the complication in the designing and manufacturing and high cost, and thus it would be difficult to obtain a desired accuracy, so that the desired frequency and phase characteristics could not be attained.

Moreover, if a transversal type surface acoustic wave filter for extracting a signal within a specific frequency band is realized by providing transmitter and receiver side transducers on the substrate having the anisotropy, when the electrode structure of the transmitter side transducer is made of a different material than that of the receiver side transducer, a propagating velocity of a surface acoustic wave in the transmitter side transducer might be different from that in the receiver side transducer and a center frequency might shift between the transmitter side transducer and the receiver side transducer.

Further, in case of using the NSPUDT substrate having a large reflection coefficient of electrode fingers, the reflecting effect of the electrodes fingers might become too strong to control a transduction characteristic.

DISCLOSURE OF THE INVENTION

The present invention has for its object to provide a surface acoustic wave transducer and a surface acoustic wave filter, in which the above mentioned drawbacks of the known surface acoustic wave transducer having the NSPUDT property can be removed or mitigated, and superior frequency and phase characteristics can be obtained by a simple manufacturing process.

According to the invention, a surface acoustic wave transducer comprising an anisotropic piezoelectric substrate being cut to have a natural single-phase unidirectional transducer property and at least one transducer structure having an exciting electrode structure and a reflector structure formed on said substrate, characterized in that when $\lambda$ is a wavelength of a fundamental surface acoustic wave, said exciting electrode structure includes a positive electrode having a plurality of electrode fingers arranged at a pitch $\lambda$ and a negative electrode having at least one electrode finger interdigitally arranged between said electrode fingers of the positive electrode with a center distance of $\lambda/2$, that said reflector transducer includes a plurality of electrode fingers arranged with a center distance of $\lambda/2$, and that a distance $L_g$ between said exciting electrode structure and the reflector structure is set to $L_g=(2n+1)\lambda/4$ (n being a positive integer).

In a conventional piezoelectric substrate without the anisotropy, a reflection center may be situated at a center of an electrode finger although a reflection occurs at input and output side edges of the electrode finger. Contrary to this, in the piezoelectric substrate being cut to have the natural single-phase unidirectional transducer behavior, a phase rotation of ±45° is added by the reflection. Due to this 45° phase rotation, the reflection center is subjected to a phase shift of $\lambda/8$ relative to the center of the electrode finger in a positive or negative direction of the operating direction determined by the NSPUDT property of the substrate. The present invention can realize the unidirectional transducer having the directivity which is opposite to the operating direction due to the NSPUDT property of the substrate by suitably utilizing the anisotropy of the substrate, the reflection effect of the electrode and the reflection effect of the reflector structure. For instance, in case of using a STX+25° cut quartz substrate, the 45° phase rotation is induced by the reflection and the reflection center is shifted by $\lambda/8$ in a positive direction of the operating direction determined by the NSPUDT property of the substrate. Therefore, when a distance between the exciting electrode structure and the reflector structure (a center distance between an electrode finger of the exciting electrode structure and an electrode finger of the reflector structure, said electrode fingers being adjacent to each other) is set to a value of $(2n+1)\lambda/4$ (n being a positive integer), a surface acoustic wave propagating in the forward direction toward the reflector structure, reflected by the reflector structure and propagating in the backward direction (the operating direction determined by the NSPUDT property) becomes in-phase with respect to a surface acoustic wave emitted by the exciting electrode structure in the backward direction, and these surface acoustic waves intensify each other. This results in the transducer having the reversed directivity. In this transducer, a reflecting effect becomes a sum of the reflection effect by the electrode finger of the exciting electrode structure and the reflection effect by the electrode finger of the reflector structure. Therefore, by suitably adjusting the numbers of the electrode fingers of the exciting electrode structure and reflector structure, it is possible to realize the transducer having the directivity reversed with respect to the operating direction due to the NSPUDT behavior and the transducer having the non-reversed directivity.

According to the invention, the electrode fingers of the exciting electrode structure and reflector structure are arranged periodically at a pitch of $\lambda/2$, and the reflection effect by the reflector structure itself is suitably utilized. It should be noted that there is also a known transducer having the exciting electrode and reflector arranged on a bidirectional substrate without the anisotropy. However, this known transducer differs inherently from the present invention in that the phase of the reflected wave is shifted by deviating the reflector with respect to the exciting electrode. That is to say, in the known transducer of the reflection bank type, the electrode fingers of the reflector are periodically shifted with respect to the electrode fingers of the exciting electrode by $\lambda/2$. If this known arrangement is applied to the anisotropic substrate having the NSPUDT behavior, it would be impossible to utilize the reflection effect efficiently to realize a practical transducer.

Furthermore, in case of using an anisotropic substrate such as $Li_2B_4O_7$ substrate having a cut angle, represented by Euler's angle, of $\phi=0°$, $\theta=51°$ and $\phi=90°$, in said substrate a phase rotation of −45° being produced by the reflection, since the phase shift of $\lambda/8$ is introduced in a direction opposite to the orientation of the substrate, when a distance between the exciting electrode structure and the reflector structure is set to $(2n+1)\lambda/4$ (n being a positive integer), a surface acoustic wave emitted by the exciting electrode structure in a direction opposite to the operating direction of the NSPUDT property has same phase with a surface acoustic wave reflected by the reflector structure. In this manner, it is also possible to realize the transducer having the reversed directivity. In case of forming the transversal type surface acoustic wave filter by providing the transmitter side transducer and receiver side transducer on a piezoelectric substrate, both the transmitter and receiver side transducers may be formed by one and same electrode material, and thus a manufacturing process becomes much simpler.

BRIEF DESCRIPTION OF THE DRAWINGS

FIGS. 2A–2E are schematic views illustrating a positional relationship between the exciting center and the reflecting center for explaining operational characteristics when normal type electrode structures are is provided on various substrates;

FIGS. 5A–5E are schematic views depicting the electrode structure and operating characteristic of a first embodiment of the surface acoustic wave transducer according to the invention;

FIGS. 6A–6E are plan views showing the electrode structure of a second embodiment of the surface acoustic wave transducer according to the invention;

FIGS. 7A–7E are schematic views illustrating a third embodiment of the surface acoustic wave transducer according to the invention;

FIG. 8 is a schematic view expressing the structure of an element for confirming the directivity;

FIG. 9 is a graph expressing a characteristic of a transducer formed by proving the electrode structure shown in FIG. 5 on an STX+25° cut quartz substrate;

FIG. 10 is a schematic view representing an element for confirming the property of the transducer illustrated in FIG. 7;

FIG. 11 is a graph expressing a characteristic of a transducer formed by proving the electrode structure shown in FIG. 6 on an STX+25° cut quartz substrate;

FIG. 20 is a schematic plan view showing a modification of the surface acoustic wave filter according to the invention.

BEST MODE OF PRACTICING THE INVENTION

Figure 1:
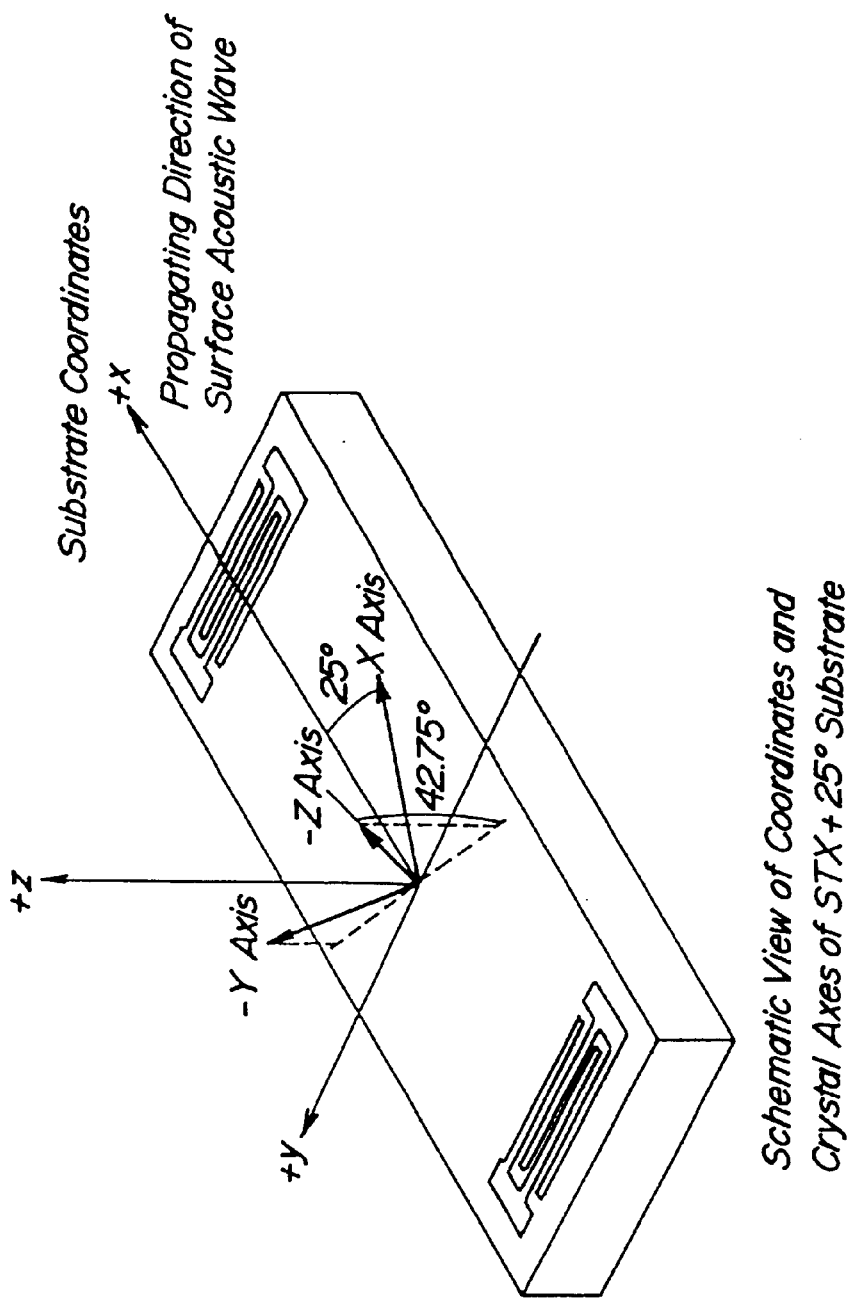
FIG. 1 is a perspective view showing a relationship between coordinates and crystal axes of an STX+25° cut quartz substrate having the NSPUDT behavior.

FIG. 1 shows a relationship between coordinates (x, y, z) of an STX+25° cut quartz substrate having the NSPUDT property and crystal axes (X, Y, Z).

FIG. 2 illustrates the electrode structure of a normal type electrode of $\lambda/4$ provided on a lithium tetraborate substrate having cut angles of (0°, 51°, 90°) represented by the Euler's angle ($\phi$, $\theta$, $\phi$) and the exciting center and reflecting center for explaining the operation thereof. Such a normal type electrode may be advantageously used in the surface acoustic wave transducer according to the invention. As illustrated in FIGS. 2A and 2B, each of positive and negative electrodes 11 and 12 has electrode fingers 11a and 12a having a width $\lambda/4$ and arranged at a pitch $\lambda$. These electrode fingers are arranged interdigitally with an edge distance of $\lambda/4$ viewed in a propagating direction of a surface acoustic wave, and may be made of, for instance aluminum.

FIG. 2C shows exciting and reflecting centers of the surface acoustic wave generated in a piezoelectric substrate without the NSPUDT property, for instance an ST cut quartz having the normal type electrode of $\lambda/4$ made of generally used aluminum provided thereon. Here, a white arrow $X_E$ denotes the exciting center of the electrode and a black arrow $X_R$ represents the reflecting center of the electrode. It has been assumed that a reflection coefficient $r_0 = |r_0| e^{-j90°}$. Therefore, in the normal type electrode, the excited surface acoustic wave and reflected surface acoustic wave do not have any phase difference in both the right-hand and left-hand directions, so that no directivity appears.

FIGS. 2D and 2E show the principle of the operation of the Single-Phase Unidirectional Transducer. In case of using an STX+25° cut quartz substrate as the piezoelectric substrate having the NSPUDT, the reflecting center $X_R$ is shifted rightward by $\lambda/8$ with respect to the exciting center $X_E$ as shown in FIG. 2D. In this manner, when the reflecting center $X_R$ can be shifted with respect to the exciting center $X_E$ such that a distance $L_{AB}=3\lambda/8$ and a distance $L_{AC}=\lambda/8$, as long as the surface acoustic wave propagating rightward as indicated by an arrow is concerned, a propagating distance of the surface acoustic wave reflected from the left-hand reflecting center $X_R$ with respect to the reference position of the exiting center $X_E$ may be derived by considering the reflection phase such that $3\lambda/8 \times 2 + \lambda/4 = \lambda$. This reflected wave has the same phase as the surface acoustic wave emitted by the exciting center $X_E$, and thus the surface acoustic waves propagating in the right-hand direction intensify each other. Similarly, when the surface acoustic wave propagating in the left-hand direction is considered, a surface acoustic wave reflected by the right-hand side reflecting center $X_R$ propagates over a propagating distance of $\lambda/8 \times 2 + \lambda/4 = \lambda/2$ and becomes opposite phase to the excited surface acoustic wave propagating in the left-hand direction. Therefore, the surface acoustic wave propagating in the left-hand direction and that reflected by the right-hand reflecting center are cancelled out. In this manner, the directivity directing to the rightward can be attained.

When use is made of a lithium tetraborate piezoelectric substrate having a cut angle of (0°, $\theta$, 90°) ($\theta$=32-86°), the situation becomes opposite to that of the quartz substrate as illustrated in FIG. 2E, and the surface acoustic waves propagating in the left-hand direction intensify each other. In this manner, the leftward directivity can be obtained.

Figure 3:
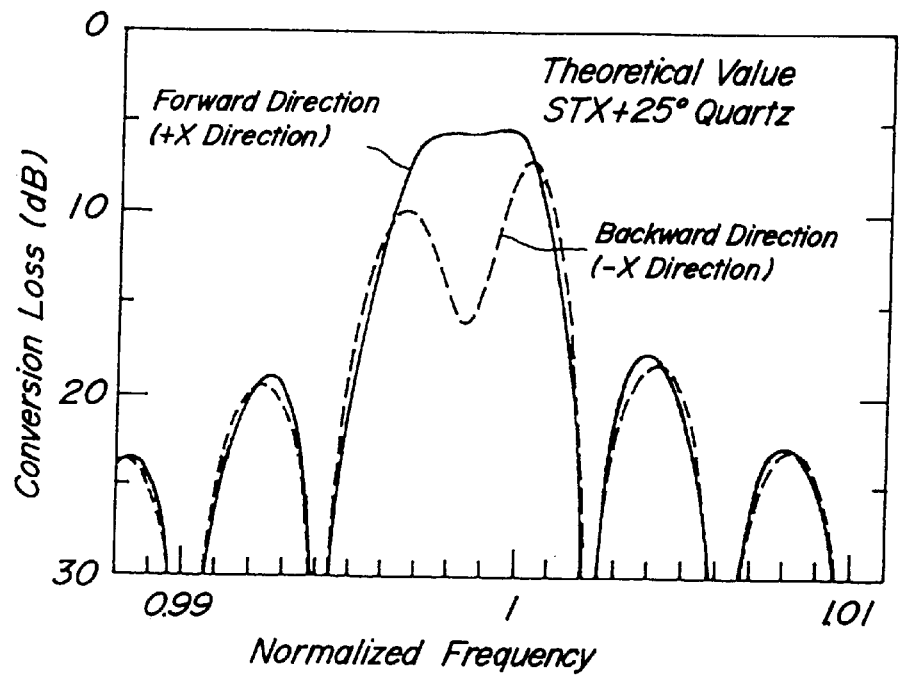
FIG. 3 is a graph representing a conversion loss of a surface acoustic wave transducer, in which the normal type electrode of $\lambda/4$ is formed on the STX+25° cut quartz substrate.

FIG. 3 is a graph showing a conversion loss when the normal type electrode of $\lambda/4$ is provided on the above mentioned STX+25° cut quartz substrate having the NSPUDT property, and a frequency on a horizontal axis is normalized by a center frequency of the surface acoustic wave transducer. It was assumed that an aperture length, which may be defined as a distance over which the electrode fingers 11a and 12a of the positive and negative electrodes 11 and 12 viewed in the propagating direction are overlapped, is 250$\lambda$ and the number of pairs of the positive and negative electrode fingers 11a and 12a is 250. Then, the theoretical conversion loss was calculated by means of the simulation using a monitor electrode having fifty pairs of split electrodes.

Figure 4:
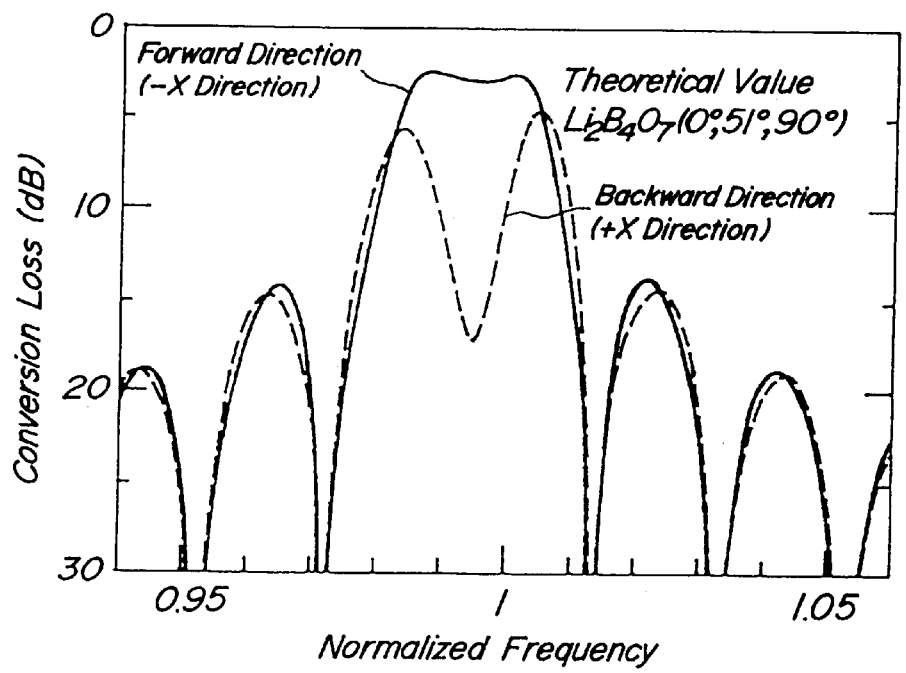
FIG. 4 is a graph representing a conversion loss of a surface acoustic wave transducer having the NSPUDT property, in which the normal type electrode of $\lambda/4$ is formed on a lithium tetraborate substrate.

FIG. 4 represents the conversion loss for the above mentioned lithium tetraborate piezoelectric substrate having the NSPUDT, in which the theoretical value was derived by assuming the aperture length to 200$\lambda$ and the number of pairs to 50.

In the manner explained above, in case of using the substrate having the NSPUDT property, it is understood that the directivity can be obtained by providing the normal type electrode of $\lambda/4$. In general, in case of constructing the transversal type surface acoustic wave device such as the SAW filter, it is necessary to oppose the forward direction of the transmitter side transducer to that of the receiver side transducer. Therefore, it is required to realize a surface acoustic wave transducer in which the directivity determined by the NSPUDT property is reversed. In this case, it is possible to realize surface acoustic wave transducers having the mutually opposite directivities by combining different electrode materials such as aluminum and gold through a plurality of fine processing steps. However, then the manufacturing process becomes complicated and a yield becomes lower due to a possible misalignment of patterns, and thus the surface acoustic wave device becomes expensive. Moreover, in some substrates, gold and aluminum have the same sign for the reflection coefficient, and therefore this solution could not be applied to such substrates.

In general, it has been known that the reflection coefficient per a unit electrode is changed in accordance with substrate material, electrode material, and electrical conditions, thickness and width of the electrode. This has been described in, for instance, "A Collection of Theses of Lectures in Acoustical Society of Japan", pp. 645–646, March 1985. The present invention is to provide the transducer formed on the substrate having the NSPUDT property as well as the surface acoustic wave filter by utilizing such a fact.

FIG. 5 is schematic views showing the electrode structure and operations of a first embodiment of the surface acoustic wave transducer according to the invention. In this embodiment, an STX+25° cut quartz substrate is used as the substrate showing the NSPUDT behavior. The transducer of the present embodiment comprises such a construction that a plurality of transducer structure pairs each including an exciting electrode structure and a reflector structure are aligned along the operating direction of the surface acoustic wave due to the NSPUDT property of the substrate. It should be noted that for the sake of clarity, only a portion including two pairs of the transducer structures is shown in the drawing. A positive direction of an operating direction due to the NSPUDT property of the substrate is denoted by an arrow +X. An operating direction due to the NSPUDT property specific to the anisotropic substrate denoted by an arrow Y is obtained when the normal type electrode of $\lambda/4$ is formed on the substrate, into said operating direction almost all excited energy being directed. A first transducer structure 20 comprises an exciting electrode structure 21 and a reflector structure 22. The first exciting electrode structure 21 includes a positive electrode 23 having two electrode fingers 23a and 23b which are arranged with a center distance of $\lambda$, where $\lambda$ is the wavelength of the surface acoustic wave, and a negative electrode 24 having an electrode finger 24a arranged between the electrode fingers of the positive electrode. A distance between the electrode fingers of the positive and negative electrodes is set to $\lambda/2$. A width of these electrode fingers viewed in the operating direction of the surface acoustic wave due to the NSPUDT property is set to $\lambda/4$. The reflector structure 22 comprises an electrode structure in which $2m$ electrode fingers (in the present embodiment, twelve electrode fingers) are arranged periodically along the propagating direction of the surface acoustic wave at a pitch of $\lambda/4$.

Similarly, the second transducer structure 30 comprises exciting electrode structure 31 and reflector structure 32. The exciting electrode structure 31 also includes a positive electrode 33 having two electrode fingers 33a and 33b which are arranged with a center distance of $\lambda$ and a negative electrode 34 having an electrode finger 34a arranged between the fingers of the positive electrode with a center distance of $\lambda/2$. The reflector structure 32 also comprises twelve electrode fingers (in the drawing, only two finger are shown) periodically arranged at a pitch of $\lambda/2$. A width of these electrode fingers is also set to $\lambda/4$. The positive electrodes 23 and 33 of respective transducer structures 20 and 30 are connected with each other by means of a first bus bar 35, and the negative electrodes 24 and 34 are coupled with each other by means of a second bus bar 36.

In the present embodiment, a distance between adjacent exciting electrode structure and the reflector structure (a center distance between the electrodes 23b and 22a, and a center distance between the electrode fingers 33b and 32a) is set to $3\lambda/4$. A distance between the first transducer structure 20 and the second transducer structure 30 (a distance between the last electrode finger 22b of the reflector structure 22 viewed in the propagating direction of the surface acoustic wave and the electrode finger 33a of the positive electrode of the adjacent second transducer structure 30) is set to $(2m+1)\lambda/4$ (in the present embodiment $3\lambda/4$). Therefore, a distance between the exciting electrode structure of the first transducer structure 20 and the exciting electrode structure of the second transducer structure 30 becomes $8\lambda$, and thus the exciting operation is carried out in-phase. All the electrodes are made of aluminum and have the same thickness as illustrated in FIG. 5B.

FIG. 5C represents the transduction and reflection centers when the above mentioned electrode structure is formed on a piezoelectric substrate without the NSPUDT property, and FIG. 5D shows the transduction and reflection centers when the same electrode structure is formed on an anisotropic piezoelectric substrate such as the STX+25° cut quartz substrate, in which the reflected wave is subjected to the phase rotation of +45° due to the NSPUDT property. As depicted in FIG. 5C, when the substrate has no NSPUDT property, the center of transduction becomes identical with the center of the reflection and there is not introduced any phase shift between the transduction center of the exciting electrode structure and the reflection center of the reflector structure. Contrary to this, as shown in FIG. 5D, the phase rotation of +45° is introduced by the reflection by the electrode fingers due to the NSPUDT property of the substrate, and thus the reflection centers of respective electrode fingers is shifted by $\lambda/8$ in the positive direction of the operating direction determined by the NSPUDT behavior of the substrate.

Now a phase of a surface acoustic wave which is excited by the electrode finger 23b of the positive electrode of the first transducer structure in the operating direction of the NSPUDT property (rightward in the drawing), is reflected by the reflector structure and is brought back into the electrode finger 23b will be considered. A distance between the center of transduction of the electrode finger 23b and the center of reflection of the electrode finger 22a becomes equal to $(3\lambda/4+\lambda/8)$. Therefore, a time period during which the surface acoustic wave generated by the electrode finger 23b propagates to the electrode finger 22a, is reflected by the same electrode finger and arrives at the electrode finger 23b becomes equal to $2\times(3\lambda/4+\lambda/8)+\lambda/4=2$ upon being expressed by the phase, when the phase shift by the reflection of $\lambda/4$ is considered. This surface acoustic wave becomes in-phase with respect to the surface acoustic wave emitted by the electrode finger 23b in a direction opposite to the operating direction +X due to the NSPUDT property, and these surface acoustic waves intensify each other. Further, a distance between the electrode finger 22a of the reflector structure and the other electrode fingers is set to an integer multiple of $\lambda/2$, and therefore the in-phase relationship is maintained between the relevant electrode finger of the exciting electrode structure and all the electrode fingers of the reflector structure. Similarly, the same in-phase relationship is present for the remaining electrode fingers 23a and 24a of the exciting electrode structure. In the succeeding transducer structure 30, the surface acoustic waves propagating in the left-hand direction in the drawing intensify each other. In this manner, in all the transducer structures, the forward direction directing to the leftward is obtained, and this forward direction of the transducer is opposite to the operating direction due to the NSPUDT property of the substrate. Therefore, according to the invention, the transducer having the reversed directivity can be realized by the exciting electrode structure and reflector structure.

FIG. 5E shows the centers of the transduction and reflection when the anisotropic piezoelectric substrate is formed by a $(0°, 51°, 90°)$ cut $Li_2B_4O_7$ substrate. The $(0°, 51°, 90°)$ cut $Li_2B_4O_7$ substrate introduces a phase rotation of $-45°$, and thus the reflection is shifted leftward which is opposite to that in the STX+25° cut quartz substrate, so that the forward direction of the transducer becomes +X direction. It should be noted that the operating direction due to the NSPUDT property of the (0°, 51°, 90°) cut $Li_2B_4O_7$ substrate is opposite to that of the STX+25° cut quartz substrate, and therefore it is possible to realize the transducer having the directivity which is opposite to the operating direction of the substrate.

FIG. 6 depicts a second embodiment of the surface acoustic wave transducer according to the invention. The transducer of the present embodiment has basically the same electrode structure, but the numbers of respective exciting electrode structures and reflector structures differ from those of the electrode structure shown in FIG. 5. The effect of the reflection due to the electrode fingers may be considered to be identical for both the exciting electrode and reflector electrode. Since respective electrode fingers are formed at a pitch of λ/2, the reflection effect by the electrode fingers may be considered to be equivalent to a sum of reflection effects of respective electrode fingers. The reflection effect by the electrode fingers of the exciting electrode structure intensify the surface acoustic wave excited in the operating direction due to the NSPUDT property, but decreases the surface acoustic wave excited in the negative direction opposite to the operating direction. In the transducer shown in FIG. 5, the number of the electrode fingers of the exciting electrode structure is three and the number of the electrode fingers of the reflector structure is twelve. In this case, since the number of the electrode fingers of the reflector structure is large than that of the exciting electrode structure, the reflection effect by the electrode fingers of the reflector structure becomes manifest and appears remarkably. Therefore, it is possible to obtain the transducer having the directivity opposite to the operating direction due to the NSPUDT property of the substrate.

Contrary to this, in the embodiment illustrated in FIG. 6, the number of the electrode fingers of the exciting electrode structure is five and the number of the electrode fingers of the reflector structure is four. Therefore, the reflection effect by the respective electrode fingers of the exciting electrode structure becomes predominant, and almost all energy is excited in the operating direction determined by the NSPUDT property. Therefore, for both the STX+25° cut quartz substrate and (0°, 51°, 90°) cut $Li_2B_4O_7$ substrate, the forward direction becomes identical with the operating direction due to the NSPUDT property of the substrate. In this manner, it is possible to realize the transducer having the non-reversed directivity. As can be apparent from this result, according to the invention, it is possible to realize the transducer having the reversed or non-reversed directivity by merely changing the numbers of the electrode fingers, while the electrode structure has basically the same construction. It should be noted that in case of using an NSPUDT substrate having the large reflection coefficient such as the (0°, 51°, 90°) cut $Li_2B_4O_7$ substrate, the reflection effect by the electrode finger is very strong, and thus the forward direction can be changed by slightly changing the numbers of the electrode fingers.

FIG. 7 shows schematically a third embodiment of the surface acoustic wave transducer according to the invention. In the present embodiment, the anisotropic piezoelectric substrate may be formed by any of the substrate such as the STX+25° cut quartz substrate in which the reflected wave is subjected to the phase rotation of +45°, and the substrate such as the $Li_2B_4O_7$ in which the reflected wave is subjected to the phase rotation of −45°. The electrode structure of the present embodiment is basically identical with that of the first embodiment shown in FIG. 5. Therefore, portions in the present embodiment similar to those of the first embodiment are denoted by the same reference numerals used in FIG. 5. In the present embodiment, a distance $L_g$ between the exciting electrode structure 21 and the reflector structure 22 is set to nλ/2 (in this embodiment λ/2), and a distance between the transducer structure 20 of a certain stage and the electrode structure 30 of a succeeding stage (a distance between centers of adjacent electrode fingers 22b and 33a) is also set to nλ/2 (in this embodiment λ/2). The remaining structure of the present embodiment is identical with that of the transducer shown in FIG. 5. Here, FIG. 7C illustrates centers of the transduction and reflection of respective electrode fingers in case of using the bidirectional substrate without the NSPUDT property, FIG. 7D represents centers of the transduction and reflection of respective electrode fingers in the anisotropic substrate (such as STX+25° cut quartz substrate) in which the reflected wave is subjected to the phase rotation of +45°, and FIG. 7E depicts the centers of the transduction and reflection in the isotropic substrate (such as $Li_2B_4O_7$ substrate) in which the reflected wave is subjected to the phase rotation of −45°.

In the anisotropic substrate shown in FIG. 7D, the surface acoustic wave reflected by the reflector structure 22 toward the left-hand side in the drawing (the direction opposite to the operating direction of the substrate) becomes opposite-phase with respect to the surface acoustic wave excited by the exciting electrode structure 21 in the left-hand direction, and thus these surface acoustic waves are cancelled out. On the other hand, the surface acoustic wave emitted by the exciting electrode structure 31 in the left-hand direction and reflected by the reflector structure 22 in the right-hand direction (in the operating direction of the substrate) becomes in-phase with respect to the surface acoustic wave emitted by the exciting electrode structure 31 in the right-hand direction. This results in the transducer having the forward direction which is directed to the positive direction of the operating direction due to the NSPUDT property of the substrate.

Also in the anisotropic substrate illustrated in FIG. 7E, the above mentioned reflection effect can be attained, and the transducer whose forward direction is directed to the positive direction of the operating direction due to the NSPUDT property of the substrate can be realized. In this manner, according to the invention, it is possible to realize the transducer having the directivity which is opposed or not opposed to the operating direction due to the NSPUDT property by simply setting the distance between the exciting electrode structure and the reflector structure to a suitable value. Therefore, the basically identical electrode structure can be utilized in the transmitter and receiver side transducers of the transversal type filter, and thus very useful advantages can be obtained.

Now the confirmation of the directivity of the above mentioned transducers will be explained. The directivity was confirmed by using an element having the structure shown in FIG. 8. The transducer structure illustrated in FIG. 5 was formed on the STX+25° cut quartz substrate, and λ/8 split electrodes having no directivity were arranged on both sides of the transducer structure. Then, a frequency characteristic monitored by the non-directional electrodes was calculated by the mode theory. Conditions are follows:

Repetition number of transducer structures 10 groups

The number of electrode fingers of reflector 30

The number of pairs of exciting electrodes 5 pairs

Distance between exciting electrode structure and reflector structure 3λ/4

Aluminum thickness 0.02λ

The number of monitor electrode pairs 50 pairs

Result of the simulation is shown in FIG. 9. As can be seen from FIG. 9, the forward direction is in the −X direction and is opposite to that shown in FIG. 3. From this result, it can be understood that the transducer shown in FIG. 5 may be advantageously used as the receiver side transducer in the transversal type filter using the anisotropic substrate with the NSPUDT property.

Next, the directivity of the transducer illustrated in FIG. 7 was confirmed by using an element having the structure shown in FIG. 10. Result of this confirmation is represented in FIG. 11. As can be seen from FIG. 11, it was confirmed that the forward direction is in the positive direction of the operating direction due to the NSPUDT property. Therefore, by providing the transducer shown in FIG. 7 on the anisotropic substrate having the NSPUDT property, it may be used as the transmitter side transducer of the transversal type filter.

Figure 12:
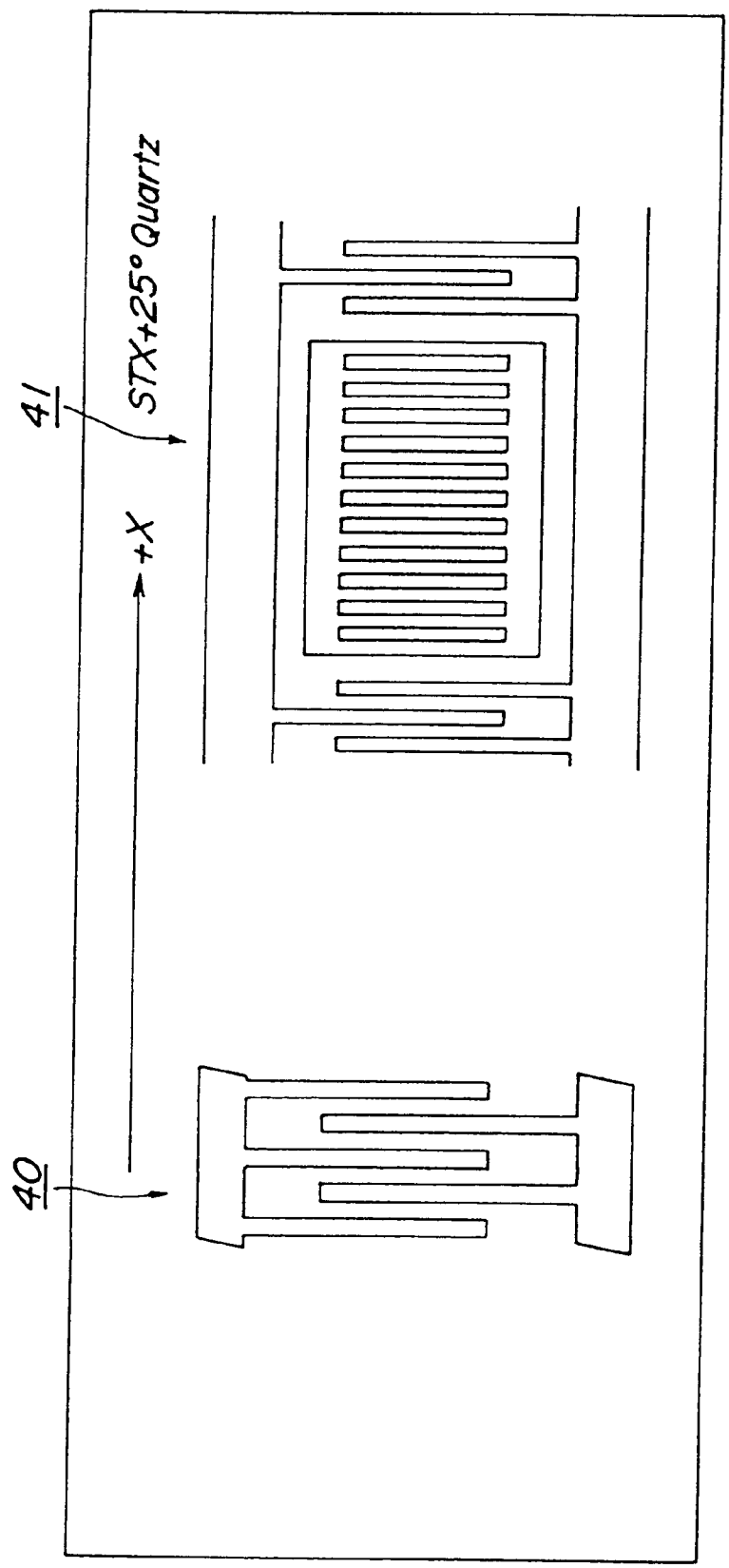
FIG. 12 is a schematic plan view showing the electrode structure of a first embodiment of the surface acoustic wave filter according to the invention.

Next, the transversal type surface acoustic wave filter according to the invention will be explained. FIG. 12 illustrates a first embodiment of the surface acoustic wave filter according to the invention. In the present embodiment, an STX+25° cut quartz substrate is used as the substrate having the NSPUDT property, the normal type electrode having the electrode finger width of $\lambda/4$ shown in FIG. 2 is used as a transmitter side transducer 40, and the transducer having the reversed directivity shown in FIG. 5 is used as a receiver side transducer 41. Then, the transmitter and receiver side transducers may be formed by the same electrode material. It should be noted that when the substrate is formed by the (0°, 51°, 90°) cut $Li_2B_4O_7$ substrate, a substrate in which the direction +X is reversed may be used.

Next, result of simulation for the transduction characteristic of the surface acoustic wave filter illustrated in FIG. 12 will be explained.
(Receiver Side Transducer)

The number of exciting electrode structure 7 pairs

The number of electrode fingers of reflector 34

Figure 13:
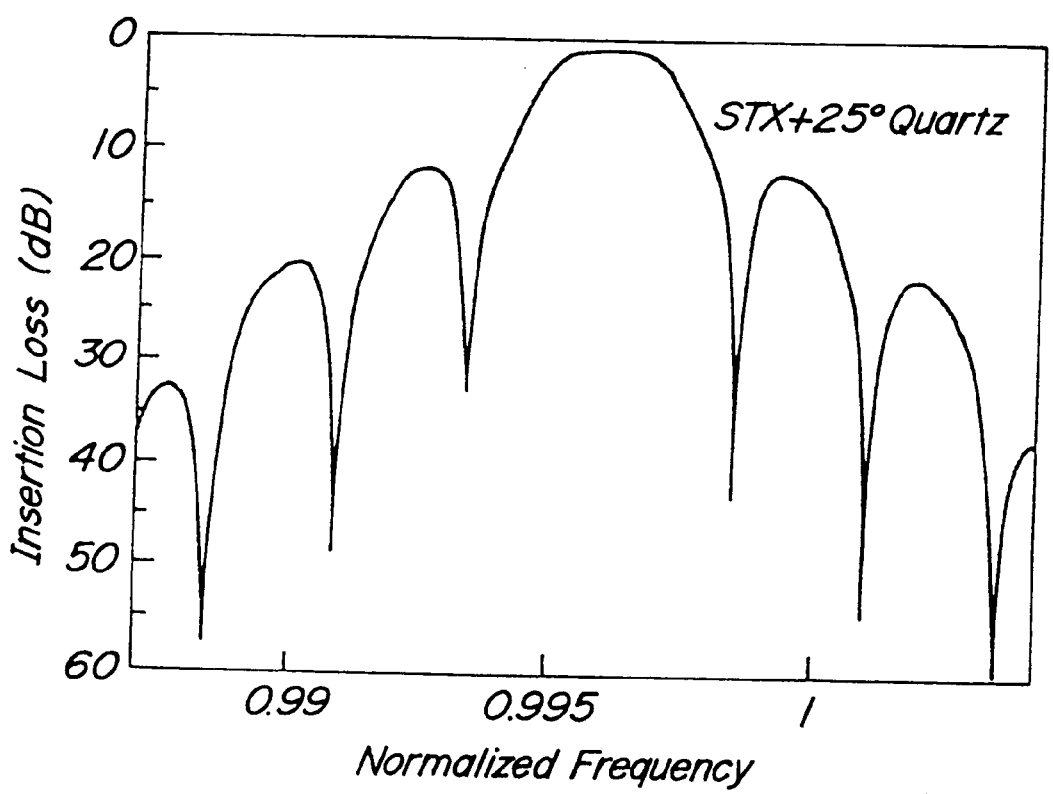
FIG. 13 is a graph representing the frequency characteristic of the first embodiment of the surface acoustic wave filter according to the invention.

Repetition number of transducer structures 16 pairs
(Transmitter Side Transducer)
$\lambda/4$ Normal Type Electrode The number of electrode pairs 112 pairs Result of this simulation is represented in FIG. 13. As can be seen from FIG. 13, it was confirmed that a very low insertion loss such as about 1 dB can be obtained.

Figure 14:
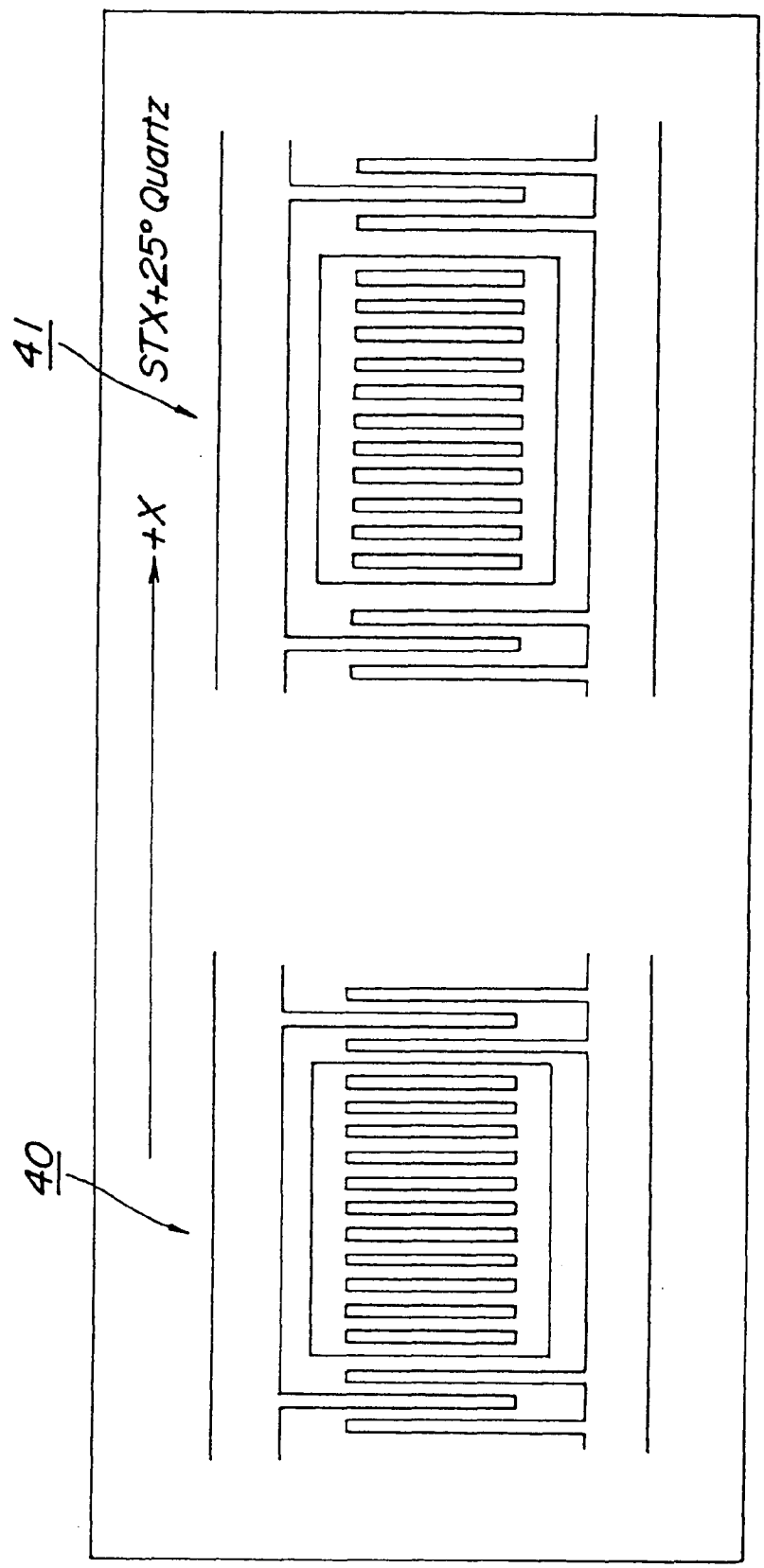
FIG. 14 is a plan view depicting the electrode structure of a second embodiment of surface acoustic wave filter according to the invention.

FIG. 14 is a schematic view showing a second embodiment of the surface acoustic wave filter according to the invention. In this embodiment, an STX+25° cut quartz substrate is used as the substrate having the NSPUDT property, the transducer having the electrode structure shown in FIG. 7 is used as a transmitter side transducer 40, and the transducer having the electrode structure illustrated in FIG. 5 is used as a receiver side transducer 41. Also in this filter, a transduction characteristic with a very low loss can be obtained. The same may be applied to the (0°, 51°, 90°) cut $Li_2B_4O_7$ substrate.

Figure 15:
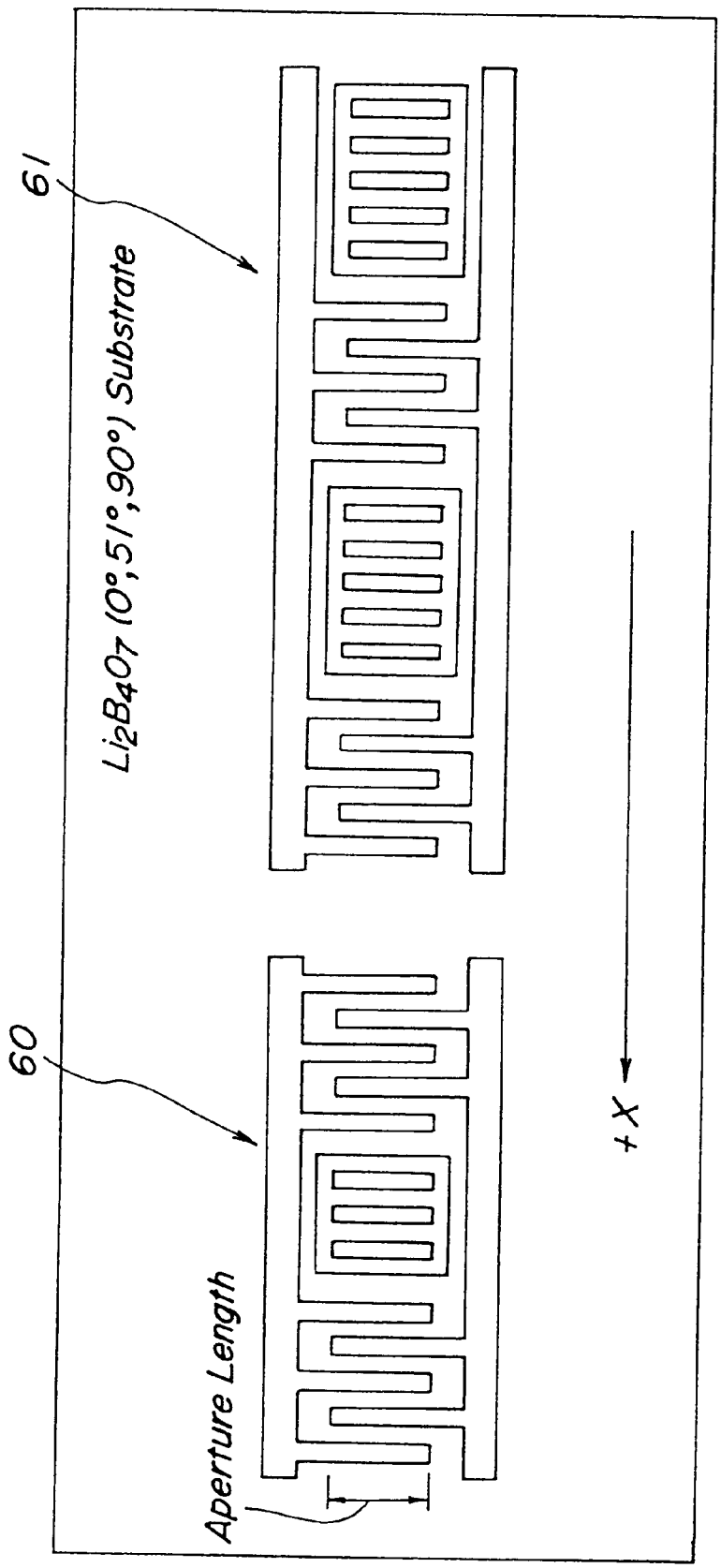
FIG. 15 is a schematic view illustrating a third embodiment of the surface acoustic wave filter according to the invention.

FIG. 15 is a schematic view depicting a third embodiment of the surface acoustic wave filter according to the invention. In the present embodiment, the substrate is formed by the $Li_2B_4O_7$ substrate in which the reflected surface acoustic wave is subjected to the phase rotation of −45°. The transducer with the non-reversed directivity shown in FIG. 6 is used as a transmitter side transducer 60, and the transducer with the reversed directivity illustrated in FIG. 5 is used as a receiver side transducer 61. These transmitter and receiver side transducers have the basically same electrode structure, but the number of electrode fingers of the exciting electrode structure and the number of electrode fingers of the reflector structure are different for the transmitter side and receiver side. Therefore, the electrode fingers of the transmitter and receiver side transducers may be formed at the same pitch, and thus the manufacturing precision can be further improved.

Figure 16:
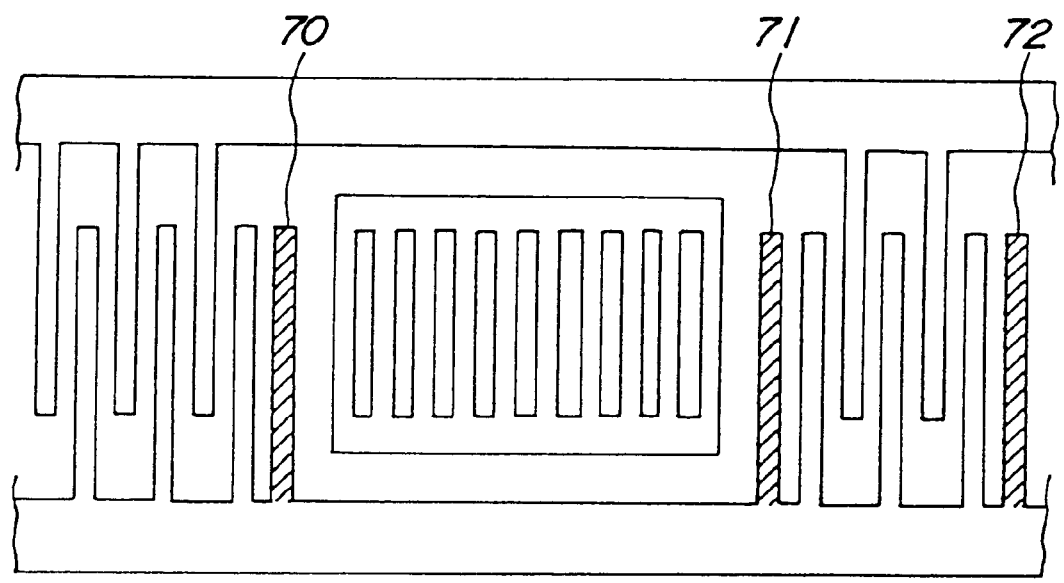
FIG. 16 is a schematic plan view showing a modification of the transducer according to the invention.

FIG. 16 is a schematic view depicting a modification of the surface acoustic wave transducer according to the invention. In the present embodiment, the weighting is performed for the transducer shown in FIG. 5 by partially removing the electrode fingers of the exciting electrode structures. The weighting method by the partial removal is an effective method. In case of partially removing the electrode fingers, the acoustic velocity is locally changed and a bulk wave is generated, which might cause the spurious. In order to avoid such a drawback of the partially removing method, dummy electrodes 70, 71 and 72 are provided at edges of the exciting electrode structures as shown in FIG. 16, said dummy electrodes not performing the exciting operation. By constructing the transducer in this manner, electrode fingers having a width of $\lambda/4$ are distributed over the whole transducer at a distance of $\lambda/4$, and thus the manufacturing accuracy is improved and noise can be reduced.

Figure 17:
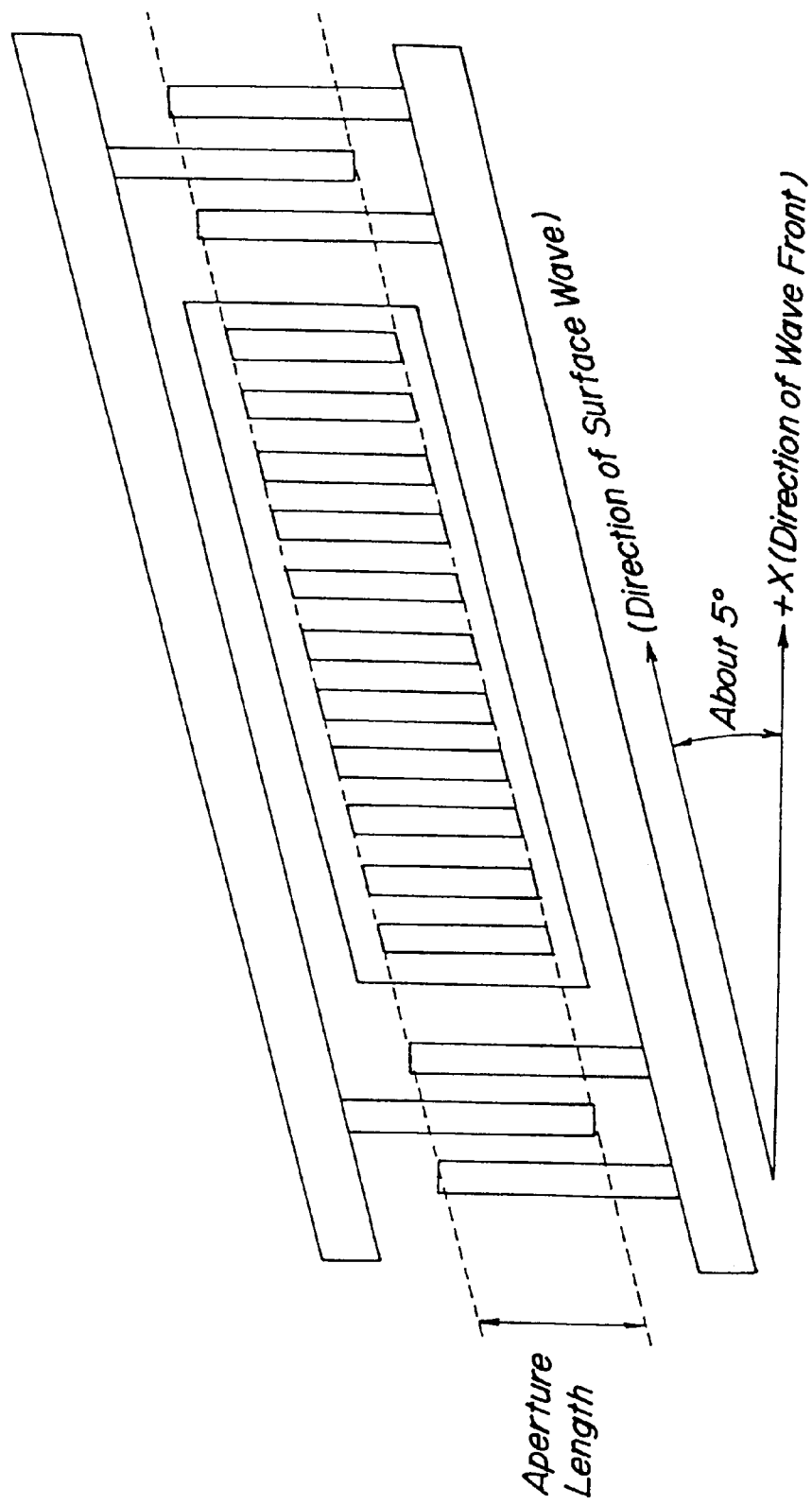
FIG. 17 is a schematic plan view depicting a modification of the transducer according to the invention.
Figure 18:
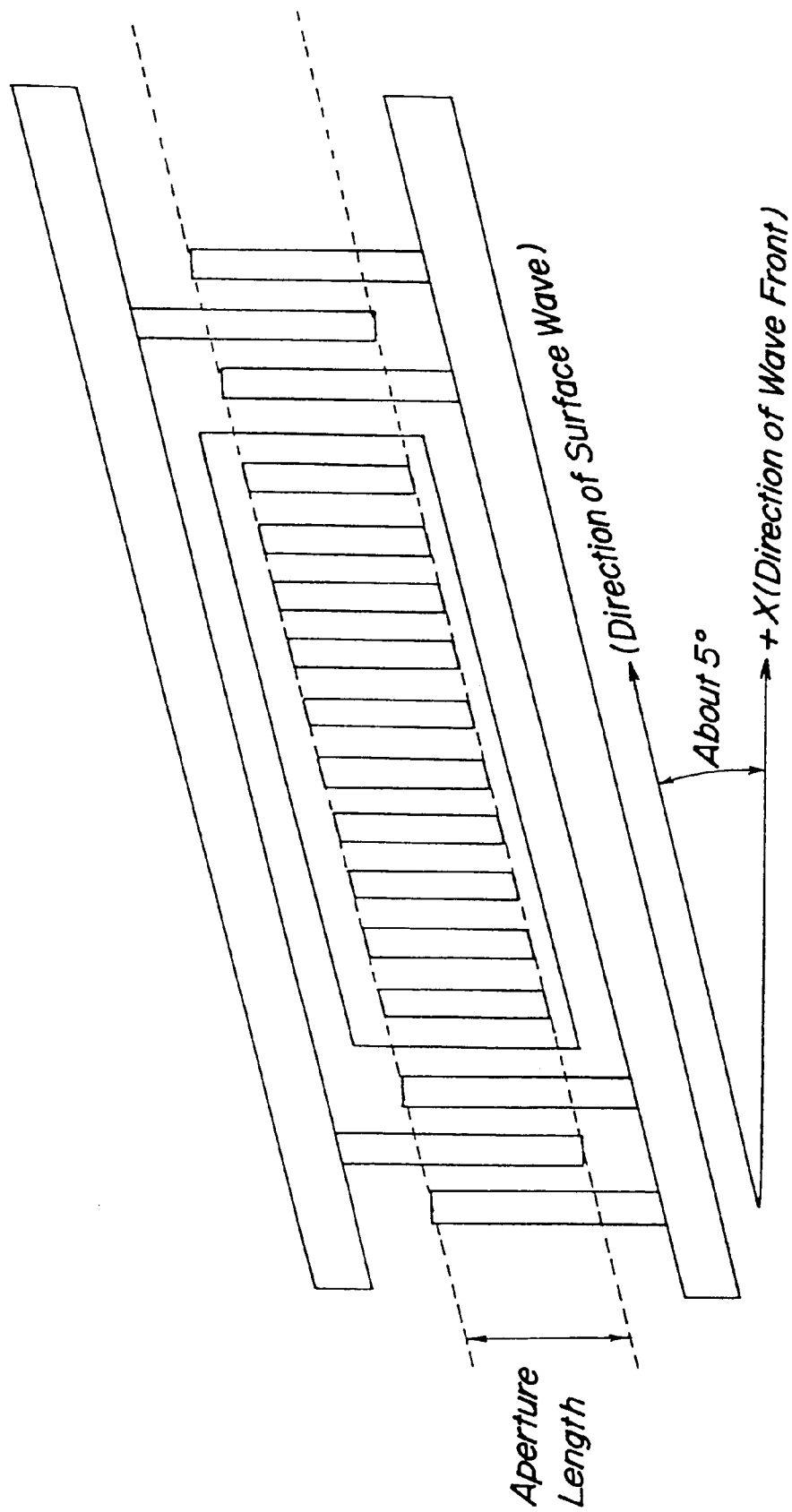
FIG. 18 is a schematic plan view showing a modification of the transducer according to the invention.

FIGS. 17 and 18 are schematic views depicting modified embodiments of the transducer according to the invention. There are some NSPUDT substrates having such a characteristic that the surface acoustic wave excited by the exciting electrode structure propagates, if the diffraction is ignored, in a direction which is deviated from the propagating direction (+X direction), while the wave front in the excited state is kept as it is (power flow angle). When a beam steering angle is not zero, in the electrode structures shown in FIGS. 2, 5, 6 and 7, the efficiency might be decreased due to the fact that not all wave fronts of the excited surface acoustic wave do pass through the exciting section. Furthermore, due to the deviation of the wave front, the wave reflected by the electrode is not partially overlapped with the excited wave, and thus there might be produced a distribution in the directivity over a direction perpendicular to the propagating direction. Particularly, in the filter in which the transmitter and receiver side transducers are opposed to each other as shown in FIGS. 12, 14 and 15, the surface acoustic wave could not be received efficiently. Particularly, the decrease in the efficiency manifests in the filter having a large size in the propagating direction. In the STX+25° cut quartz substrate, the beam steering angle is 5.4°. In FIGS. 17 and 18, the electrodes are shifted in a parallel manner in a direction perpendicular to the propagating direction in accordance with the beam steering angle of the STX+25° cut quartz substrate.

Figure 19:
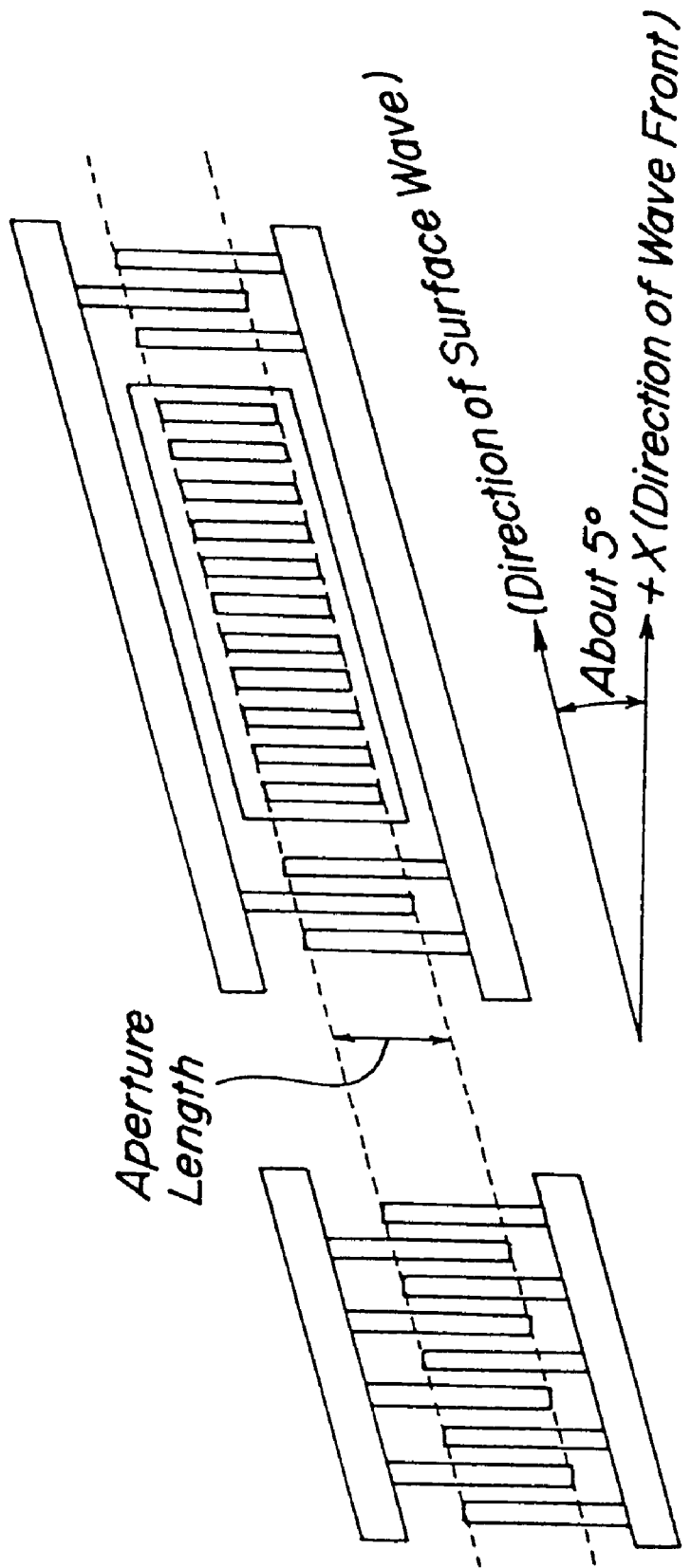
FIG. 19 is a schematic plan view illustrating a modification of the surface acoustic wave filter according to the invention.

FIGS. 19 and 20 are schematic views depicting filters formed by the transducer according to the invention. On the substrate having the not zero beam steering angle such as the STX+25° cut quartz substrate, there are formed the transmitter and receiver side transducers which are inclined in accordance with the power flow angle, and further the axes of the transmitter and receiver side surface acoustic wave transducers are adjusted so as to receive efficiently the surface acoustic wave beam which deviates in accordance with the propagation. In this manner, it is possible to obtain a much lower loss.

The present invention is not limited to the embodiments explained above, but many modifications and alternations may be conceived. For instance, the anisotropic substrates in which the phase rotation of 45° is introduced by the reflection are used, but according to the invention it is also possible to use any substrate which shows a phase rotation other than 45°. In such a case, the adjustment could be performed by changing a width of electrode fingers in the operating direction of the NSPUDT property.

In the above mentioned embodiments, a single transducer is composed of a plurality of transducer structures, but the transducer may be composed of a single transducer structure, i.e. a single exciting electrode and a single reflector structure.

In the previously explained embodiments, the lithium tetraborate substrate having the cut angles of $\phi=0°$, $\theta=51°$ and $\psi=90°$ expressed by the Euler's angle notation ($\phi$, $\theta$, $\psi$) and STX+25° cut quartz substrate are used as the piezoelectric substrate, but according to the invention, it is also possible to use a lithium tetraborate substrate having another cut angle and showing the NSPUDT property. That is to say, it is possible to use a lithium tetraborate substrate having a cut angle of $\phi=-5°-+5°$, $\theta=9°-29°$ and $\psi=85°-95°$. Moreover, it is also possible to use a substrate other than lithium tetraborate and quartz. For example, lithium tantalate (LiTaO$_3$) of YZ+51.25° cut and lithium niobate (LiNbO$_3$) of Y-$\theta$X ($\theta=25°-45°$) cut or 128° rotated Y cut may be used as the substrate having the NSPUDT property.

Moreover, the desired object can be attained even if the width, pitch and edge distance of various electrodes are deviated from the above mentioned values within about ±10% due to a possible error in the fine processing. Further, if the directivity deviates due to an error in the cut angle or substrate material, this deviation may be corrected by changing widths of electrode fingers.

As explained above, in the surface acoustic wave transducer according to the invention, the directivity of the substrate with the NSPUDT property can be reversed, and thus it is possible to realize a filter having low loss and good phase characteristic by combining the substrate with the normal type electrode. Moreover, since the electrodes can be formed by a single fine processing, a manufacturing process can be made simple, a yield can be increased and a cost can be decreased.

Furthermore, according to the invention, the reflection effect by the reflector structure is efficiently utilized, the directivity can be reversed even if the substrate having a small reflection coefficient such as the STX+25° cut quartz substrate is used. Heretofore, a substrate having a high reflection coefficient such as the Li$_2$B$_4$O$_7$ of (0°, 51°, 90°) cut Li$_2$B$_4$O$_7$ has been considered not to be used practically. However, according to the invention, such a substrate can be used, because the undesired reflected wave can be canceled by suitably utilizing the reflection effect of the reflector. In this manner, according to the invention, the reflection effect can be controlled by the electrode fingers in a suitable manner, and the transducer having an excellent transduction property can be realized.

Further, in the embodiments of the surface acoustic wave transducer according to the invention, in which the positive and negative electrodes and floating electrodes are formed by the same material, the manufacturing process can be very simple and the accuracy of dimension can be attained easily. Therefore, the insertion loss can be reduced materially and the frequency and phase characteristics can be improved by a combination with the piezoelectric substrate having the NSPUDT property. This performance of the surface acoustic wave transducer according to the invention can be also maintained for the NSPUDT substrate having the power flow angle due to the deformation.

Particularly, the transducer structure may be formed by arranging the electrode fingers having a width of $\lambda/4$ periodically, and thus the manufacturing accuracy and transduction characteristic can be further improved.

What is claimed is:

1. A surface acoustic wave transducer comprising an anisotropic piezoelectric substrate being cut to have a natural single-phase unidirectional transducer property and at least one transducer structure having an exciting electrode structure and a reflector structure formed on said substrate, characterized in that when $\lambda$ is a wavelength of a fundamental surface acoustic wave, said exciting electrode structure includes a positive electrode having a plurality of electrode fingers arranged at a pitch $\lambda$ and a negative electrode having at least one electrode finger interdigitally arranged between said electrode fingers of the positive electrode with a center distance of $\lambda/2$, that said reflector transducer includes a plurality of electrode fingers arranged with a center distance of $\lambda/2$, and that a distance $L_g$ between said exciting electrode structure and the reflector structure is set to $L_g=(2n+1)\lambda/4$, n being a positive integer, and when m is a positive integer, the number $N_E$ of the electrode fingers of said exciting electrode structure is set to $N_E=2m+1$, and the number $N_R$ of the electrode fingers of said reflector structure is set to $N_R=2m$.

2. A surface acoustic wave transducer according to claim 1, characterized in that said anisotropic piezoelectric substrate having said natural single-phase unidirectional transducer property is selected from the group consisting of STX+25° cut quartz substrate, quartz substrate having a cut angle (45°, 55°, 0°) expressed by the Euler's angle ($\phi$, $\theta$, $\psi$), YZ+51.25° cut lithium tantalate (LiTaO$_3$) substrate, Y-$\theta$X ($\theta=25°-45°$) cut lithium niobate (LiNbO$_3$) substrate, 128° Y-$\theta$X cut lithium niobate (LiNbO$_3$) substrate (23°<$\theta$<40°), and lithium tetraborate (Li$_2$B$_4$O$_7$) substrate having a cut angle expressed by the Euler's angle notation of $\phi=-5°-+5°$, $\theta=9°-29°$, 32°-86° and $\psi=85°-95°$.

3. A surface acoustic wave transducer according to claim 1, characterized in that when m and m' are positive integers, the number of $N_E$ of the electrode fingers of said exciting electrode structure is set to $N_E=2m+1$, and the number of $N_R$ of the electrode fingers of said reflector structure is set to $N_R=2m'$, said number $N_E$ of the electrode fingers of said exciting electrode structure and said number $N_R$ of the electrode fingers of said reflector structure are set to satisfy a condition $N_E<N_R$ and a forward direction is set to a negative direction of an operating direction due to the NSPUDT property of the substrate.

4. A surface acoustic wave transducer according to claim 1, characterized in that said number $N_E$ of the electrode fingers of said exciting electrode structure and said number $N_R$ of the electrode fingers of said reflector structure are set to satisfy a condition $N_E>N_R$ and a forward direction is set to a positive direction of an operating direction due to the NSPUDT property of the substrate.

5. A surface acoustic wave transducer according to claim 1, characterized in that a width of the electrode fingers of said exciting electrode structure and reflector structure is set to about $\lambda/4$.

6. A transversal type surface acoustic wave filter comprising a piezoelectric substrate being cut to have a natural single-phase unidirectional transducer property, a transmitter side transducer formed on the substrate and a receiver side transducer formed on the substrate, characterized in that each of said transmitter and receiver side transducers comprises a plurality of transducer structures arranged to have forward directions due to the NSPUDT property of the substrate aligned with each other, each of said transducer structures including an exciting electrode structure and a reflector structure, that when $\lambda$ is a wavelength of a fundamental surface acoustic wave, each of said exciting electrode structures includes a positive electrode having a plurality of electrode fingers arranged at a pitch $\lambda$ and a negative electrode having at least one electrode finger interdigitally arranged between said electrode fingers of the positive electrode with a center distance of $\lambda/2$, that each reflector transducer includes a plurality of electrode fingers arranged with a center distance of $\lambda/2$, that in each of the transducer structures, a distance $L_g$ between said exciting electrode structure and the reflector structure and a distance between successive transducer structures are set to $3\lambda/4$, that when m and m' are positive integers, the number $N_E$ of electrode fingers of each of the exciting electrode structures is set to $N_E=2m+1$ and the number $N_R$ of electrode fingers in each of the reflector structures is set to $N_R=2m'$, and that in respective transducer structures of one of the transmitter and receiver side transducers, $N_E>N_R$ is satisfied and in respective transducer structures of the other transducer, $N_E<N_R$ is satisfied.

7. A surface acoustic wave transducer comprising an anisotropic piezoelectric substrate being cut to have a natural single-phase unidirectional transducer property and at least one transducer structure having an exciting electrode structure and a reflector structure formed on said substrate, characterized in that when $\lambda$ is a wavelength of a fundamental surface acoustic wave, said exciting electrode structure includes a positive electrode having a plurality of electrode fingers arranged at a pitch $\lambda$ and a negative electrode having at least one electrode finger interdigitally arranged between said electrode fingers of the positive electrode with a center distance of $\lambda/2$, that said reflector transducer includes a plurality of electrode fingers arranged with a center distance of $\lambda/2$, and that a distance $L_g$ between said exciting electrode structure and the reflector structure is set to $L_g=n\lambda/2$, n being a positive integer, and when m and m' are positive integers, the number $N_E$ of the electrode fingers of said exciting electrode structure is set to $N_E=2m+1$, and the number $N_R$ of the electrode fingers of said reflector structure is set to $N_R=2m'+1$.

8. A surface acoustic wave transducer comprising an anisotropic piezoelectric substrate being cut to have a natural single-phase unidirectional transducer property and a plurality of transducer structures arranged to have operating directions due to the NSPUDT property aligned with each other, each transducer structure including an exciting electrode structure and a reflector structure formed on said substrate, characterized in that when $\lambda$ is a wavelength of a fundamental surface acoustic wave, said exciting electrode structure includes a positive electrode having a plurality of electrode fingers arranged at a pitch $\lambda$ and a negative electrode having at least one electrode finger interdigitally arranged between said electrode fingers of the positive electrode with a center distance of $\lambda/2$, that said reflector transducer includes a plurality of electrode fingers arranged with a center distance of $\lambda/2$, and that both a distance $L_g$ between said exciting electrode structure and the reflector structure and a distance $L_t$ between successive transducer structures are set to $(2n+1)\lambda/4$, n being a positive integer.

9. A surface acoustic wave transducer according to claim 8, characterized in that said distances $L_g$ and $L_t$ are set to $3\lambda/4$.

10. A surface acoustic wave transducer according to claim 9, characterized in that in each of said transducer structures, the number $N_E$ of the electrode fingers of said exciting electrode structure and the number $N_R$ of the electrode fingers of said reflector structure are set to satisfy a condition $N_E<N_R$ and a forward direction is set to a negative direction of an operating direction due to the NSPUDT property of the substrate.

11. A surface acoustic wave transducer according to claim 9, characterized in that in each of said transducer structures, the number $N_E$ of the electrode fingers of said exciting electrode structure and the number $N_R$ of the electrode fingers of said reflector structure are set to satisfy a condition $N_E>N_R$ and a forward direction is set to a positive direction of an operating direction due to the NSPUDT property of the substrate.

12. A surface acoustic wave transducer according to claim 8, characterized in that at least one of said transducer structures has a transduction characteristic which differs from that of the remaining transducer structure or structures.

13. A surface acoustic wave transducer according to claim 12, characterized in that the number of the electrode fingers of the exciting electrode structure of said at least one transducer structure differs from the number of electrode fingers of the exciting electrode structure of said remaining transducer structure or structures.

14. A surface acoustic wave transducer according to claim 13, characterized in that the exciting electrode structure of said at least one transducer structure includes at least one dummy electrode which does not contribute to the excitation.

15. A transversal type surface acoustic wave filter comprising a piezoelectric substrate being cut to have a natural single-phase unidirectional transducer property, a transmitter side transducer formed on the substrate and a receiver side transducer formed on the substrate, characterized in that either one of the transmitter and receiver side transducers is constructed by a transducer whose forward direction is directed in a positive direction of an operating direction due to the NSPUDT property of the substrate and the other transducer is constructed by a directivity-reversed transducer whose forward direction is directed in a negative direction of the operating direction due to the NSPUDT property of the substrate, that said directivity-reversed transducer includes one or more transducer structures each including an exciting electrode structure and a reflector structure, that when $\lambda$ is a wavelength of a fundamental surface acoustic wave, said exciting electrode structure includes a positive electrode having a plurality of electrode fingers arranged at a pitch $\lambda$ and a negative electrode having at least one electrode finger interdigitally arranged between said electrode fingers of the positive electrode with a center distance of $\lambda/2$, that said reflector structure includes a plurality of electrode fingers Arranged with a center distance of $\lambda/2$, and that a distance $L_g$ between said exciting electrode structure and the reflector structure is set to $L_g=(2n+1)\lambda/4$, n being a positive integer.

16. A surface acoustic wave filter according to claim 15, characterized in that said one of the transducers comprises a transducer structure including an exciting electrode structure and a reflector structure, that when $\lambda$ is a wavelength of a fundamental surface acoustic wave, said exciting electrode structure includes a positive electrode having a plurality of electrode fingers arranged at a pitch $\lambda$ and a negative electrode having at least one electrode finger interdigitally arranged between said electrode fingers of the positive electrode with a center distance of $\lambda/2$, that said reflector transducer includes a plurality of electrode fingers arranged with a center distance of $\lambda/2$, that a distance $L_g$ between said exciting electrode structure and the reflector structure is set to $(2n+1)\lambda/4$, n being a positive integer, that the number $N_E$ of the electrode fingers of said exciting electrode structure and the number $N_R$ of the electrode fingers of said reflector structure are set to satisfy a condition $N_E>N_R$ and the forward direction is set to a positive direction of the operating direction due to the NSPUDT property of the substrate.

17. A surface acoustic wave filter according to claim 15, characterized in that in said directivity-reversed transducer the number $N_E$ of the electrode fingers of said exciting electrode structure and the number $N_R$ of the electrode fingers of said reflector structure are set to satisfy a condition $N_E<N_R$ and the forward direction is set to a negative direction of the operating direction due to the NSPUDT property of the substrate.

18. A surface acoustic wave filter according to claim 17, characterized in that said directivity-reversed transducer comprises a plurality of transducer structures arranged to have propagating axes aligned with each other, each transducer structure including an exciting electrode structure and a reflector structure, that when $\lambda$ is a wavelength of a fundamental surface acoustic wave, said exciting electrode structure includes a positive electrode having a plurality of electrode fingers arranged at a pitch $\lambda$ and a negative electrode having at least one electrode finger interdigitally arranged between said electrode fingers of the positive electrode with a center distance of $\lambda/2$, that said reflector transducer includes a plurality of electrode fingers arranged with a center distance of $\lambda/2$, and that both a distance $L_g$ between said exciting electrode structure and the reflector structure and a distance $L_t$ between successive transducer structures are set to $(2n+1)\lambda/4$, n being a positive integer.

19. A surface acoustic wave filter according to claim 18, characterized in that said distances $L_g$ and $L_t$ are set to $3\lambda/4$.

20. A surface acoustic wave filter according to claim 19, characterized in that in each of said transducer structures, the number $N_E$ of the electrode fingers of said exciting electrode structure and the number $N_R$ of the electrode fingers of said reflector structure are set to satisfy a condition $N_E<N_R$ and the forward direction is set to a negative direction of the operating direction due to the NSPUDT property of the substrate.

21. A surface acoustic wave filter according to claim 15, characterized in that said transmitter side transducer includes a positive electrode having a plurality of electrode fingers arranged periodically at a pitch $\lambda$ and a negative electrode having at least one electrode fingers arranged interdigitally between the electrode fingers of the positive electrode with a center distance of $\lambda/2$.

22. A surface acoustic wave filter according to claim 15, characterized in that said one of the transducers comprises a transducer structure including an exciting electrode structure and a reflector structure, that when $\lambda$ is a wavelength of a fundamental surface acoustic wave, said exciting electrode structure includes a positive electrode having a plurality of electrode fingers arranged at a pitch $\lambda$ and a negative electrode having at least one electrode finger interdigitally arranged between said electrode fingers of the positive electrode with a center distance of $\lambda/2$, that said reflector transducer includes a plurality of electrode fingers arranged with a center distance of $\lambda/2$, and that a distance $L_g$ between said exciting electrode structure and the reflector structure is set to $n\lambda/2$, n being a positive integer.

* * * * *